United States Patent
Ba et al.

(10) Patent No.: US 8,054,912 B2
(45) Date of Patent: Nov. 8, 2011

(54) LARGE-DYNAMIC-RANGE LOOKUP TABLE FOR A TRANSMITTER PREDISTORTER AND SYSTEM AND METHOD EMPLOYING THE SAME

(75) Inventors: Seydou N. Ba, Richardson, TX (US); Khurram Waheed, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 693 days.

(21) Appl. No.: 12/142,890

(22) Filed: Jun. 20, 2008

(65) Prior Publication Data
US 2009/0051426 A1 Feb. 26, 2009

Related U.S. Application Data

(60) Provisional application No. 60/957,118, filed on Aug. 21, 2007.

(51) Int. Cl.
*H04K 1/02* (2006.01)
*H04L 25/03* (2006.01)
*H04L 24/49* (2006.01)

(52) U.S. Cl. ..................... 375/297
(58) Field of Classification Search ............. 375/297
See application file for complete search history.

(56) References Cited

U.S. PATENT DOCUMENTS

| | | | | |
|---|---|---|---|---|
| 5,049,832 A * | 9/1991 | Cavers | ........... | 330/149 |
| 5,809,075 A * | 9/1998 | Townshend | ........... | 375/254 |
| 6,463,406 B1 * | 10/2002 | McCree | ........... | 704/207 |
| 6,496,798 B1 * | 12/2002 | Huang et al. | ........... | 704/230 |
| 7,492,688 B2 * | 2/2009 | Fujita et al. | ........... | 369/59.11 |
| 7,602,320 B2 * | 10/2009 | Klein et al. | ........... | 341/110 |
| 2003/0035494 A1 * | 2/2003 | Bauder et al. | ........... | 375/296 |
| 2005/0009479 A1 * | 1/2005 | Braithwaite | ........... | 455/114.3 |
| 2005/0085199 A1 * | 4/2005 | Khan et al. | ........... | 455/114.3 |
| 2005/0270202 A1 * | 12/2005 | Haartsen | ........... | 341/143 |
| 2007/0071342 A1 * | 3/2007 | Bilbrey et al. | ........... | 382/254 |
| 2008/0198048 A1 * | 8/2008 | Klein et al. | ........... | 341/110 |

OTHER PUBLICATIONS

Michael Faulkner, et al., "Adaptive Linearization Using Predistortion—Experimental Results" IEEE Transactions on Vehicular Technology, vol. 43, No. 2, pp. 323-332, May 1994.

Ilari Teikari, et al., "Basband Digital Predistorter with Quadrature Error Correction" IEEE Norchip Conference Proc., pp. 159-162, Nov. 2004.

* cited by examiner

*Primary Examiner* — David C. Payne
*Assistant Examiner* — Erin File
(74) *Attorney, Agent, or Firm* — Ronald O. Neerings; Wade James Brady, III; Frederick J. Telecky, Jr.

(57) ABSTRACT

A predistorters for use with a nonlinear element and methods of predistorting for a nonlinear element for use in a 3G, e.g., WCDMA transmitter. In one embodiment, the predistorter includes: (1) a lookup table having non-uniformly spaced entries therein, (2) a compander configured to compand an input signal based on a nonlinearity of the nonlinear element to address the entries and (3) an interpolation offset calculation circuit associated with the lookup table and configured to produce an output based on a value of the input signal and a linear interpolation involving at least two entries from the lookup table.

29 Claims, 21 Drawing Sheets

DIRECT MAPPING

LARGE-DYNAMIC-RANGE LOOKUP TABLE FOR A TRANSMITTER PREDISTORTER AND SYSTEM AND METHOD EMPLOYING THE SAME

CROSS-REFERENCE TO PROVISIONAL APPLICATION

This application claims the benefit of U.S. Provisional Application Ser. No. 60/957,118, filed by Ba, et al., on Aug. 21, 2007, entitled "A Method for Efficient Spacing of a Large Dynamic Range Lookup-Table Implementation for a TX Predistorter," commonly assigned with the invention and incorporated herein by reference.

TECHNICAL FIELD OF THE INVENTION

The invention is directed, in general, to wireless transmitters and, more specifically, to a large-dynamic-range lookup table (LUT) for a transmitter predistorter and a system and method employing the LUT to perform predistortion.

BACKGROUND OF THE INVENTION

Many applications exist for battery-powered, digital wireless transmitters, primarily in cellular communications systems such as those operating under the International Telecommunication Union's Wideband Code Division Multiple Access (WCDMA) standard or other so-called "3G" standards. Such transmitters use one or more amplifiers to amplify components of the input signal to be transmitted. These components are amplitude and phase components in the case of a polar transmitter and in-phase and quadrature components in the case of a Cartesian transmitter.

A highly linear amplifier distorts the signal the least and so is most favored from a standpoint of signal quality. Unfortunately, highly linear amplifiers use relatively large amounts of power and numbers of highly accurate components, making them relatively power consumptive, large and expensive. Though they perform the best, they are thus disfavored in many wireless applications, particularly those that require low-cost transmitters. The amplifier that is best suited overall for low-cost, battery-powered wireless transmitters is a simple amplifier having significant nonlinearity. See, for example, FIG. 1A, in which a nonlinear amplifier 110 distorts a substantially sinusoidal input signal.

Predistortion is often used to compensate for this nonlinearity, resulting in a linearization of the output of the amplifier. The theory underlying predistortion is that, if an amplifier's distortion characteristics are known in advance, an inverse function can be applied to an input signal to predistort it before it is provided to the amplifier. Though the amplifier then distorts the signal as it amplifies it, the predistortion and the amplifier distortion essentially cancel one another, resulting in an amplified, output signal having substantially reduced distortion. See, for example, FIG. 1B, in which a digital predistorter 120 predistorts the substantially sinusoidal input signal such that the output signal is likewise sinusoidal.

In digital transmitters, digital predistortion (DPD) is most often carried out using an LUT that associates output values with input signal values. Entries in the LUT are addressed using samples of the input signal. The output values retrieved from the LUT are used either to predistort the samples (an "inverse gain" configuration) or in lieu of the samples (a "direct mapping" configuration). In modern applications such as WCDMA, samples are transmitted at a very high rate. Thus, the predistorter needs to be able to look up and retrieve output values very quickly.

The spacing between successive LUT entries defines the mapping accuracy. LUTs are capable of providing a nonlinear mapping for signals with a large dynamic range, which is essential for complying with 3G standards such as WCDMA. Most applications employ a uniformly spaced LUT. However, the performance of a uniformly spaced LUT degrades considerably at lower input signal levels because an increase in the signal dynamic range relative to the quantization level substantially decreases the signal-to-noise ratio (SNR). Nonlinear spacing techniques in which more entries are heuristically placed where the mapping is nonlinear can, in theory, mitigate this problem. Unfortunately, although these techniques improve LUT performance in some applications, they do not handle arbitrary nonlinearity well and do not work well in demanding applications, such as transmitter linearization.

A predistortion LUT is typically created when a transmitter is calibrated at the factory. Unfortunately, a factory-calibrated predistortion LUT often fails to linearize the amplifier adequately under varying operational conditions (e.g., temperature, voltage, frequency and voltage standing-wave ratio, or VSWR). Aging, especially in WCDMA and other 3G transmitters, only exacerbates the inadequacy.

SUMMARY OF THE INVENTION

To address the above-discussed deficiencies of the prior art, the invention provides predistorters for use with a nonlinear element and methods of predistorting for a nonlinear element. In one embodiment, a predistorter includes: (1) a LUT having non-uniformly spaced entries therein, (2) a compander configured to compand an input signal based on a nonlinearity of the nonlinear element to address the entries and (3) an interpolation offset calculation circuit associated with the LUT and configured to produce an output based on a value of the input signal and a linear interpolation involving at least two entries from the LUT. In another embodiment, a predistorter includes: (1) a LUT containing base-2-spaced entries, (2) an address calculation block associated with the LUT and configured to calculate addresses for the entries based on a mapping between an amplitude of an input signal and bits of the addresses and (3) an interpolation circuit associated with the LUT and configured to produce a selected one of an interpolation factor and an interpolated output based on a bin width and an offset derived from the input signal.

Another aspect of the invention provides methods of predistorting for a nonlinear element. In one embodiment, a method includes: (1) companding an input signal based on a nonlinearity of the nonlinear element to address uniformly spaced entries contained in a LUT and (2) producing an output from the LUT based on a linear interpolation involving a value of the input signal and at least two of the entries. In another embodiment, a method includes: (1) calculating addresses for base-2-spaced entries in a LUT based on a mapping between an amplitude of an input signal and bits of the addresses and (2) producing a selected one of an interpolation factor and an interpolated output based on a bin width and an offset derived from the input signal.

BRIEF DESCRIPTION OF THE DRAWINGS

For a more complete understanding of the invention, reference is now made to the following descriptions taken in conjunction with the accompanying drawings, in which.

DETAILED DESCRIPTION

Described herein are efficient LUT spacing (or mapping) techniques. One technique uses a linearly interpolated LUT (a "Lin-LUT") and a companding function to address the LUT. The companding function is based on the inverse of the nonlinearity that the predistortion is designed to correct. The result is a substantially constant performance across relevant amplitude ranges. Another technique uses a nonlinear, base-2 or modified base-2 LUT spacing that is amenable to efficient index lookup and interpolation between LUT entries. As a result, division in interpolation may no longer be needed, reducing power requirements and increasing operational speeds. Predistorters, transmitters and various methods based on the techniques will also be described.

Theoretical results that relate the spacing of a linearly interpolated LUT to the PA nonlinear characteristics for a dynamic modulation signal will be described herein. Design selection and optimization details of one embodiment of a LUT for a WCDMA transmitter predistorter will then be described. The structure of a predistorter LUTs can be critical to the performance of a WCDMA transmitter as a whole; if the discrete quantization in the LUT is inappropriately selected, both close-in and far-out transmitted signal properties may be degraded.

The described LUT configuration (i.e., spacing and interpolation technique) can be used for both polar and Cartesian transmitter architectures. For a WCDMA transmitter, the input signal may cover a dynamic range of approximately 110 dB to satisfy both power level as well as signal integrity requirements.

Figure 1A:
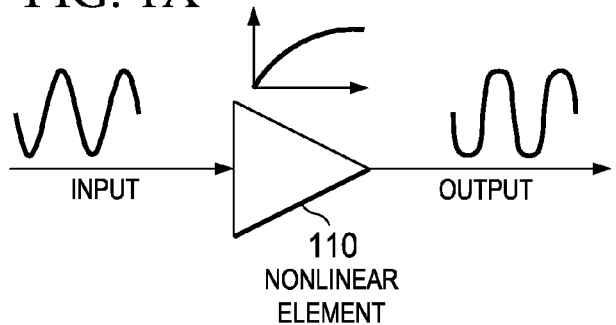
FIGS. 1A and 1B are high-level schematic diagrams showing amplifier distortion, particularly the impact of a simple compression nonlinearity on time domain signal, and a conceptual view of DPD to counteract the transmitter nonlinearity.
Figure 1B:
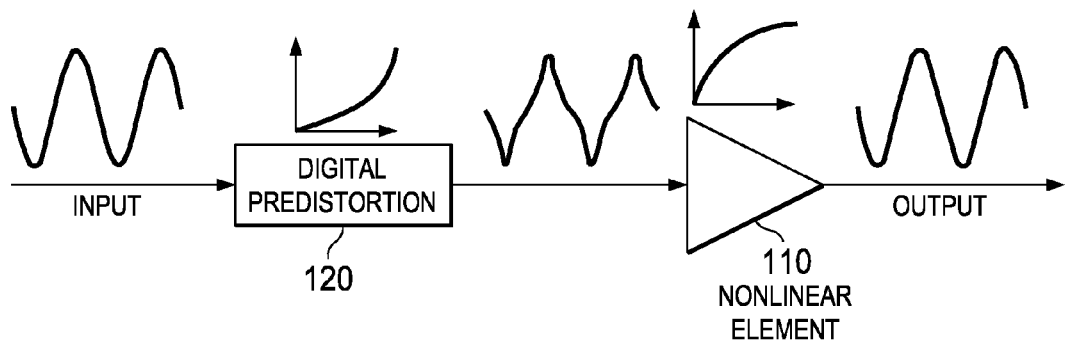

Theoretical results that relate the spacing of a linearly interpolated LUT to the probability distribution of a dynamic input signal will now be described. As FIGS. 1A and 1B signify in their use of the term "nonlinear element," a predistortion LUT can be employed to compensate for nonlinearity in any device or element, and not just an amplifier. Accordingly, the theoretical results described below, and predistorters, methods, transmitters and other systems having nonlinear elements that employ the same, are within the broad scope of the invention irrespective of the type of nonlinear element with which a predistortion LUT may be designed to operate.

1. Constant-SNR Spacing Technique for Linearly Interpolated Predistorter LUTs 1.1. Linear Interpolation in Predistorter LUTs The use of predistorters employing Lin-LUTs is an efficient way to reduce LUT approximation error (see, e.g., Faulkner, et al., "Adaptive Linearization Using Predistortion—Experimental Results," in IEEE Trans. on Veh. Technol., vol. 43, May 2004, pp. 323-332, and Teikari, et al., "Baseband Digital Predistorter with Quadrature Error Correction," in Norchip Conference Proc., November 2004, pp. 159-162). However, no evidence exists that the performance of Lin-LUTs has ever been analyzed. Therefore, the performance of Lin-LUTs will now be analyzed.

Figure 2:
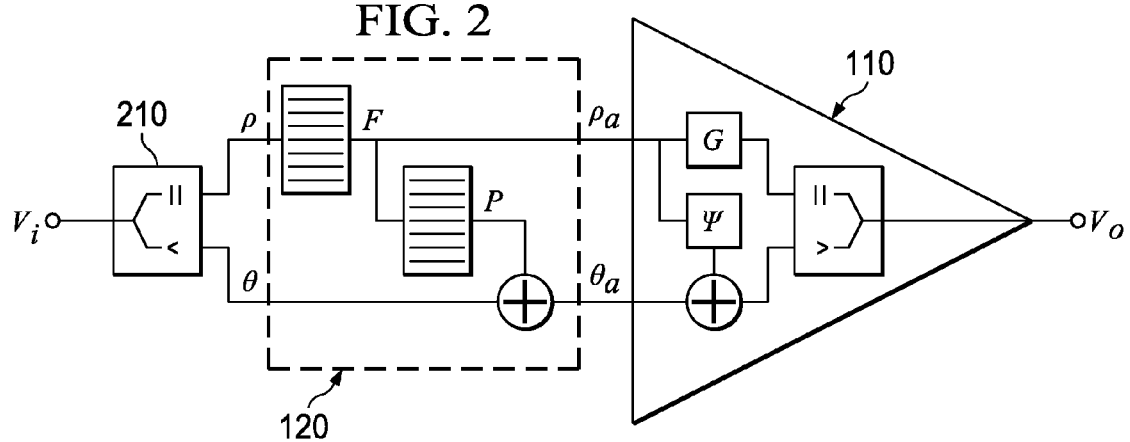
FIG. 2 is a high-level schematic diagram of a polar transmitter having a complex baseband and containing an embodiment of a transmitter predistorter.

Lin-LUTs will be analyzed in the context of a polar transmitter. However, the analysis extends easily to a Cartesian transmitter. FIG. 2 is a high-level schematic diagram of a polar transmitter having a complex baseband and containing an embodiment of a transmitter predistorter. A splitter 210 in the baseband splits an input signal $v_i$ into an amplitude component $\rho$ and a phase component $\theta$. The predistorter 120 then employs two LUTs, an LUT F to predistort the amplitude component $\rho$ and an LUT P to predistort the phase component $\theta$ to yield predistorted amplitude and phase components $\rho_a$ and $\theta_a$, respectively. The amplifier 110 then amplifies the predistorted amplitude and phase components $\rho_a$ and $\theta_a$, which are then recombined to yield an output signal $v_o$. Nonlinear amplitude modulation-amplitude modulation (AM-AM) and amplitude modulation-phase modulation (AM-PM) distortions occurring in the amplifier 110 are respectively designated by the amplitude-dependent functions $G(r)$ and $\psi(r)$.

The two LUTs in the predistorter 120 approximate the inverse of the amplifier's amplitude distortion function $F(r)=G^{-1}(r)$ and phase compensation function $P(r)=-\psi(F(r))$. The LUT approximation errors of $F(r)$ and $P(r)$ respectively result in independently computable amplitude and phase errors at the output of the amplifier. The derivations for the two types of errors are similar. Therefore, only the amplitude error will be explicitly derived herein.

To simplify mathematical expressions, the following derivation assumes that the gain and the input and output impedances of the amplifier are normalized to one (i.e., K=1). The $k^{th}$ bin of the amplitude LUT is delimited by the amplitude entries $r_k$ and $r_{k+1}$, and $d_k = r_{k+1} - r_k$ is defined to be the width of the $k^{th}$ interval. The amplitude predistorter $F(r)$ is precisely determined at $r_k$ and $r_{k+i}$. For an input amplitude $r = r_k + \delta r$, with $0 < \delta_r < d_k$, the linearly interpolated LUT results in an approximation error given by:

$$\delta_F = F''(r) \frac{\delta_r(\delta_r - d_k)}{2}, \quad (1)$$

where F" is the second-order derivative of F. The amplitude at the output of the amplifier (with normalized gain K=1) is:

$$r_o = r_k + e_{rk} = G(F + \delta_F), \quad (2)$$

where $e_{rk}$ is the amplitude error at the amplifier input. Equation (2) can be simplified using a first-order approximation as:

$$r_o = G(F(rk)) + G'(F(r_k)) \times \delta_F \quad (3)$$
$$= r_k + F'(r_k)^{-1} \times \delta_F,$$

where Equation (3) uses the relation between F and G, i.e., $F=G^{-1} \Rightarrow G'=1/F^{-1}$. F' is assumed not to change appreciably within the bin (i.e., the number of LUT entries is large enough). Therefore, the amplitude MSE is:

$$e_{rk} = r_o - r_k = \frac{F''(r_k)}{F'(r_k)} \frac{\delta_r(\delta_r - d_k)}{2}. \quad (4)$$

The noise contribution of the $k^{th}$ bin to the output SNR can be computed using the usual quantizer assumption that $\delta_r$ is a random variable uniformly distributed in $[0, d_k]$. The amplitude mean squared error (MSE) contribution of the $k^{th}$ bin is:

$$E(e_{rk}^2) = \frac{F''(r_k)^2}{4 d_k F'(r_k)^2} \int_0^{d_k} r^2(r - d_k) dr \quad (5)$$
$$= \frac{F''(r_k)^2}{120 F'(r_k)^2} d_k^4.$$

Figure 3:
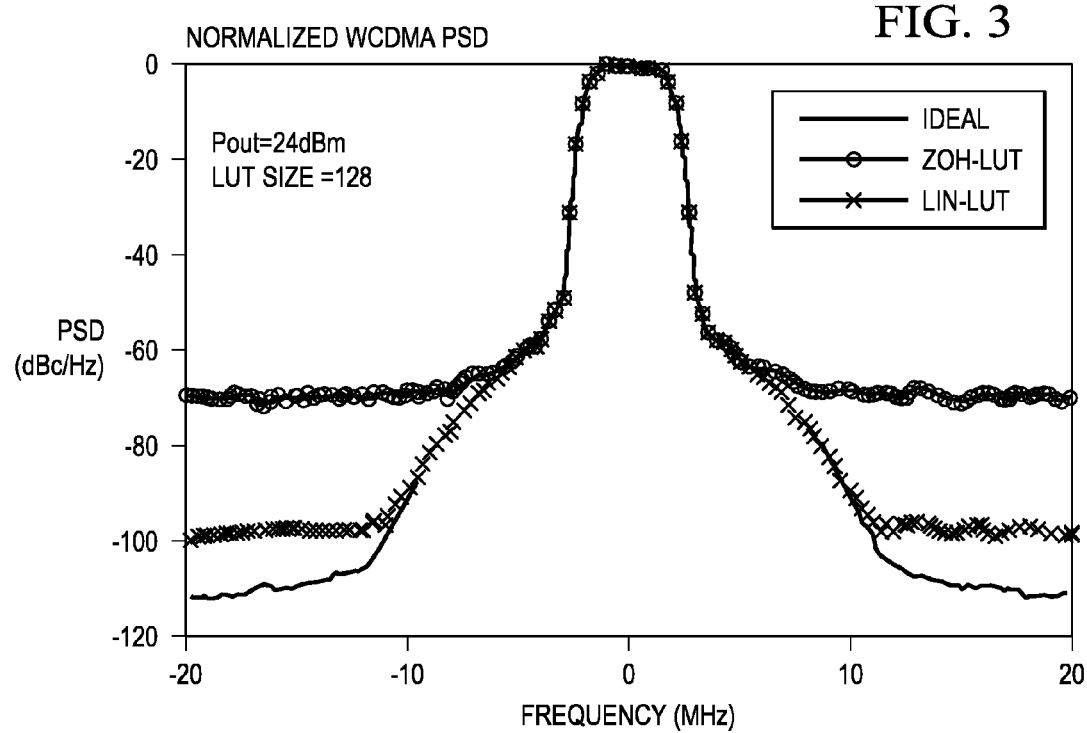
FIG. 3 is a plot of the power density distribution (PSD) of a WCDMA signal using 128-word linearly interpolated (Lin) and zero-order hold (ZOH) LUTs.

For an arbitrary LUT spacing achieved using a companding function $S(r)$, the bin width is given by:

$$d_k \approx \frac{V}{N \times S'(r_k)}, \quad (6)$$

where N is the LUT size and V is the maximum amplitude addressable by the LUT. For the special case of uniform spacing $S(r)=r$ and $d_k=V/N$ is constant. Assuming that the number of LUT bins is sufficiently large, the total amplitude MSE at the amplifier output is:

$$P_\rho = \frac{V^4}{120 N^4} \int_0^A \frac{F''(r)^2}{S'(r)^4 F'(r)^2} p(r) dr, \quad (7)$$

where $p(r)$ is the probability density function of the input amplitude and A is the maximum amplitude of the input signal. Similarly, the phase MSE can be obtained as:

$$P_\theta = \frac{\tilde{V}^4}{120 N^4} \int_0^{\tilde{A}} \frac{P''(r)^2}{S'(r)^4} p(\tilde{r}) d\tilde{r}, \quad (8)$$

where $\tilde{r}=F(r)$ is the predistorted amplitude, and $\tilde{A}$ is its maximum value. Equations (7) and (8) show that the amplitude and phase MSEs are inversely proportional to $N^4$ which is a much faster rate of decrease than a ZOH LUT can attain, resulting in an MSE that is inversely proportional to $N^2$. The predistorted signal SNR increases by 12 dB if the LUT size is doubled, as opposed to 6 dB for a ZOH LUT. FIG. 3 compares the two approaches to the ideal. For a WCDMA signal, linear interpolation improves the EVM by 25 dB, ACLR1 by 0.5 dB and ACLR2 by 17 dB.

1.2. Nonuniform Predistorter LUT Spacing

Figure 4:
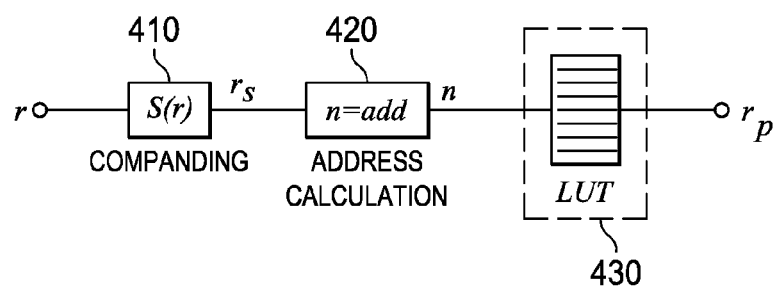
FIG. 4 is a high-level schematic diagram showing nonuniform LUT spacing using a companding function.

The nonuniform spacing of the LUT can be achieved by applying a companding function $S(r)$ 410 to the input amplitude r as FIG. 4 illustrates. Address calculation 420 is performed on the companded amplitude, and a LUT 430 lookup is then performed.

To simplify the analysis, the linearly interpolated LUT can be viewed as a piecewise linear approximation of a function $f(r)$ sampled at points $(r_k, y_k)$, where $y_k = \theta(r_k)$. The companding function then projects a set of N uniformly spaced sampling points $$r_k = r \frac{V}{N}$$

to a set of N nonuniformly spaced sampling points $\tilde{r}_k$ using the relation: $\tilde{r}_k = S^{-1}(r_k)$.

The nonuniform LUT spacing technique described herein can yield a substantially constant SNR across the entire output power dynamic range, or at least a range of interest, such that a single low-resolution, fixed-range LUT can be used for all power levels. If desired, the candidate spacing can be independent from both signal and amplifier characteristics.

μ-law companding was developed to achieve such a goal for the quantization of speech signals. Equation (9) mathematically describes μ-law companding:

$$S_\mu(r) = V \frac{\ln(1 + \mu r/V)}{\ln(1 + \mu)}. \tag{9}$$

For speech signal quantization, μ is often chosen to be equal to 256 (eight bits). But for WCDMA, a value between 32 and 64 (five to six bits) appears to provide a better performance balance across all power levels.

The resulting spacing can be derived using Equation (6):

$$d(r) \approx \frac{V}{NS'(r)} = \frac{V\mu}{N\ln(1+\mu)}(1 + \mu r/V). \tag{10}$$

Note that the LUT spacing increases linearly with the input amplitude. The resulting amplitude and phase MSEs can be calculated using Equations (7) and (8), respectively:

$$P_\rho = \frac{V^4 \mu}{120 N^4 \ln(1+\mu)} \int_0^A \frac{F''(r)^2}{F'(r)^2} (1 + \mu r/V)^4 p(r)\, dr \text{ and}$$

$$P_\theta = \frac{\tilde{V}^4 \mu}{120 N^4 \ln(1+\mu)} \int_0^{\tilde{A}} P''(\tilde{r})^2 (1 + \mu r/V)^4 p(\tilde{r})\, d\tilde{r}.$$

A companding function that yields a substantially constant SNR at all amplitudes can be derived using Equation (5). The sample-based SNR of the amplitude LUT can now be approximated by:

$$SNR(r) = \frac{r^2}{E(e_r^2)} \tag{11}$$
$$= \frac{120 N^4 r^2 S'_\rho(r)^4 F'(r_k)^2}{V^4 F''(r_k)^2}$$

In Equation (11), a constant SNR across all amplitudes can only be obtained if:

$$S'_\rho(r) = \lambda_\rho \left( \frac{F''(r)}{F'(r)} \times \frac{1}{r} \right)^{1/2}, \tag{12}$$

where $\lambda_\rho$ is a constant. The amplitude and phase LUT compander therefore can be expressed as:

$$S_\rho(r) = \lambda_\rho \int \left( \left| \frac{F''(r)}{F'(r)} \right| \times \frac{1}{r} \right)^{1/2} dr \text{ and} \tag{13}$$

$$S_\theta(r) = \lambda_\theta \int \left( |P''(r)| \times \frac{1}{r} \right)^{1/2} dr.$$

$\lambda_\rho$ and $\lambda_\theta$ are chosen such that $S_\rho(V)=V$ and $S_\theta(\tilde{V})=\tilde{V}$. $S_\rho$ and $S_\theta$ can also be numerically approximated.

2. WCDMA Transmitter Linearization Budget Analysis

The effect of transmitter nonlinearity on the transmitted WCDMA signal will now be described. A tolerable level of transmitter compression may be determined by experimentation based on a novel AM-AM compression model and a measured amplifier AM-PM profile.

Figure 5A:
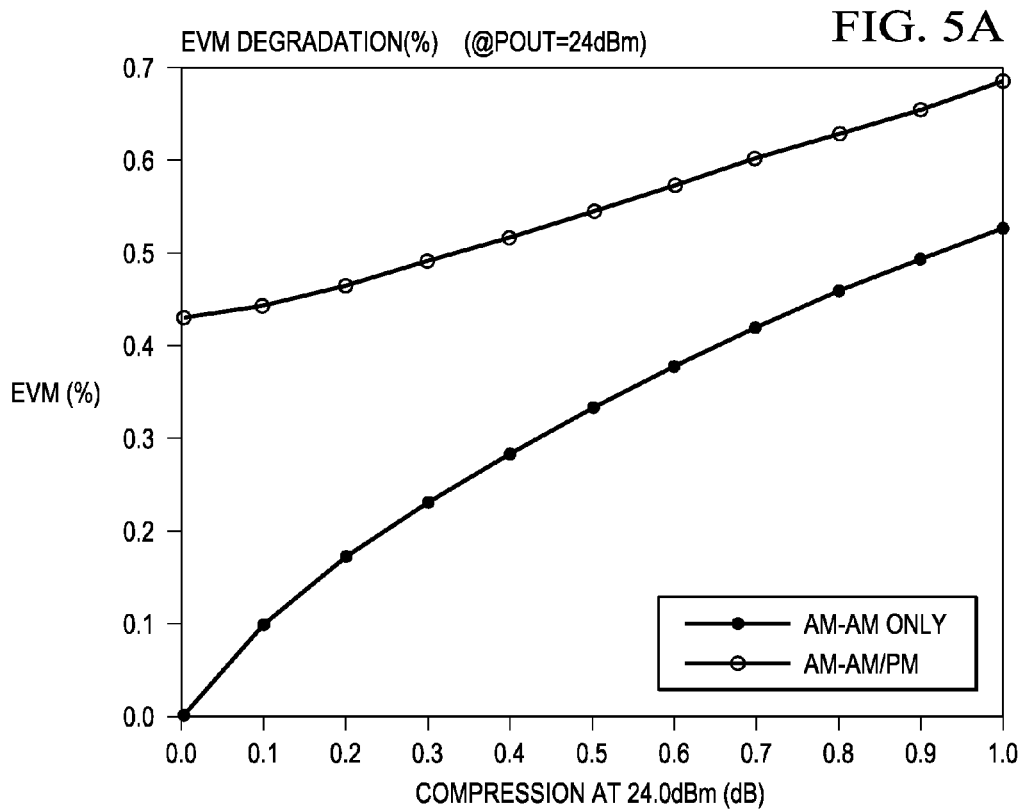
FIGS. 5A, 5B and 5C are plots showing the degradation caused by transmitter compression nonlinearity in a WCDMA transmitter in terms of error vector magnitude (EVM), a first adjacent channel leakage ratio at 5 MHz offset (ACLR1) and a second adjacent channel leakage ratio at 10 MHz offset (ACLR2), respectively.
Figure 5B:
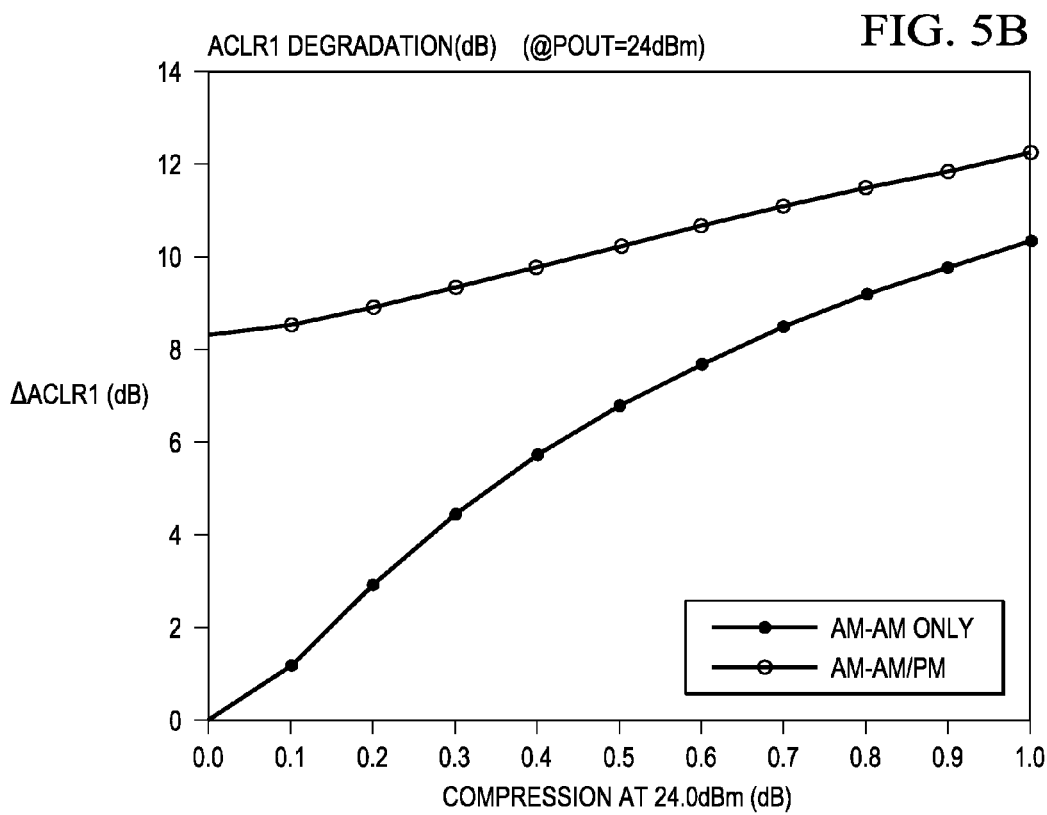
Figure 5C:
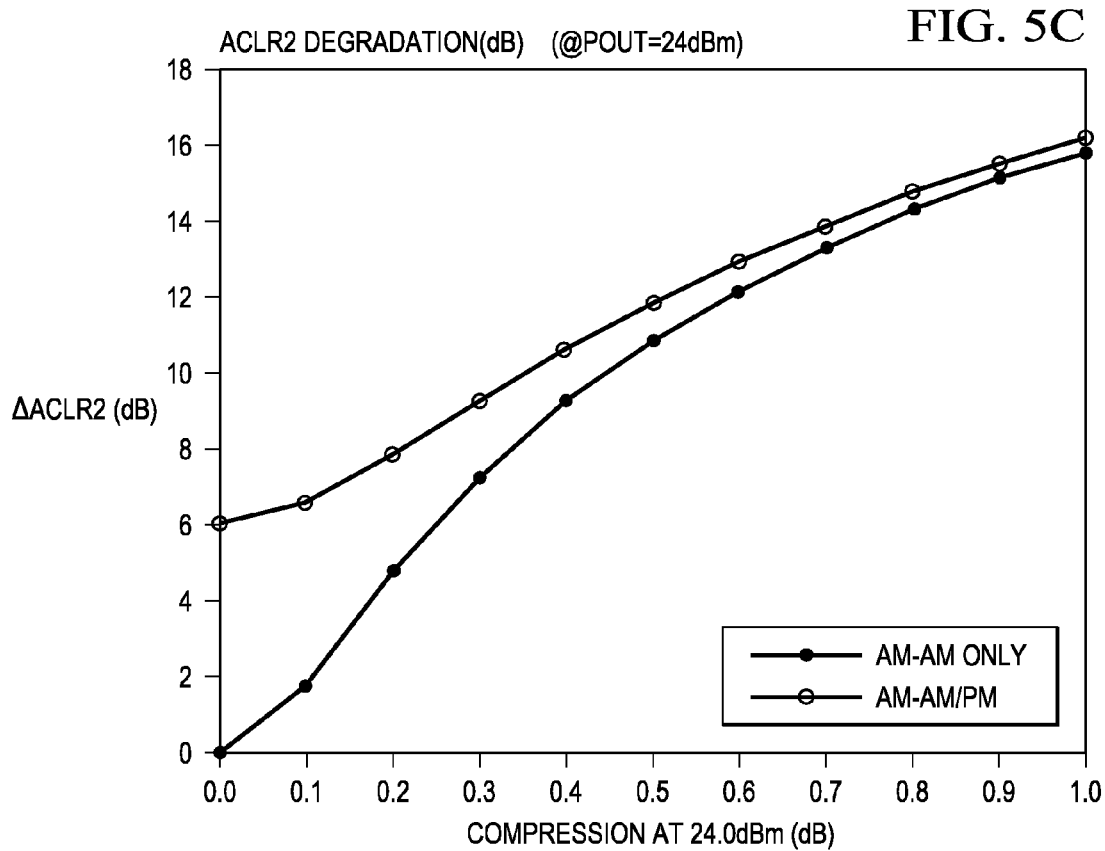

A weakly nonlinear amplifier model is used in the description that follows. The AM-PM profile was simulated by curve fitting an actual amplifier's AM-PM curve. The EVM, ACLR1 and ACLR2 were measured as a function of the compression level at 24 dBm. FIGS. 5A, 5B and 5C are plots showing the degradation caused by transmitter compression nonlinearity in a WCDMA transmitter in terms of EVM, ACLR1 and ACLR2, respectively and summarize the results.

3. Predistortion Calibration

Conventionally, factory predistortion calibration is employed to obtain the nominal behavior of the one or more amplifiers in the transmitter, which can then be used to construct nominal AM-AM and AM-PM predistortion LUTs. Predistortion calibration calls for a ramping signal or a training signal of another profile to be injected into the transmitter that covers the entire expected range of the amplifier input. The ramping signal typically has the same number of steps as the size of the predistortion LUT. Each step typically is of sufficient duration to allow the transmitter and receiver to settle. The transmitted and received data are then used to construct the calibrated predistortion LUTs.

Predistortion calibration also provides valuable information for predistortion compensation. For example, from the measurement data, the order of the polynomial that is adequate for representing the nominal nonlinearity of one or a combination of amplifiers can be determined. Calibrating under varying operating conditions yields a better estimate of the order of the compensation polynomial to be used for incremental predistortion changes due to temperature, frequency, voltage and VSWR.

4. Adaptive Predistortion

Figure 6A:
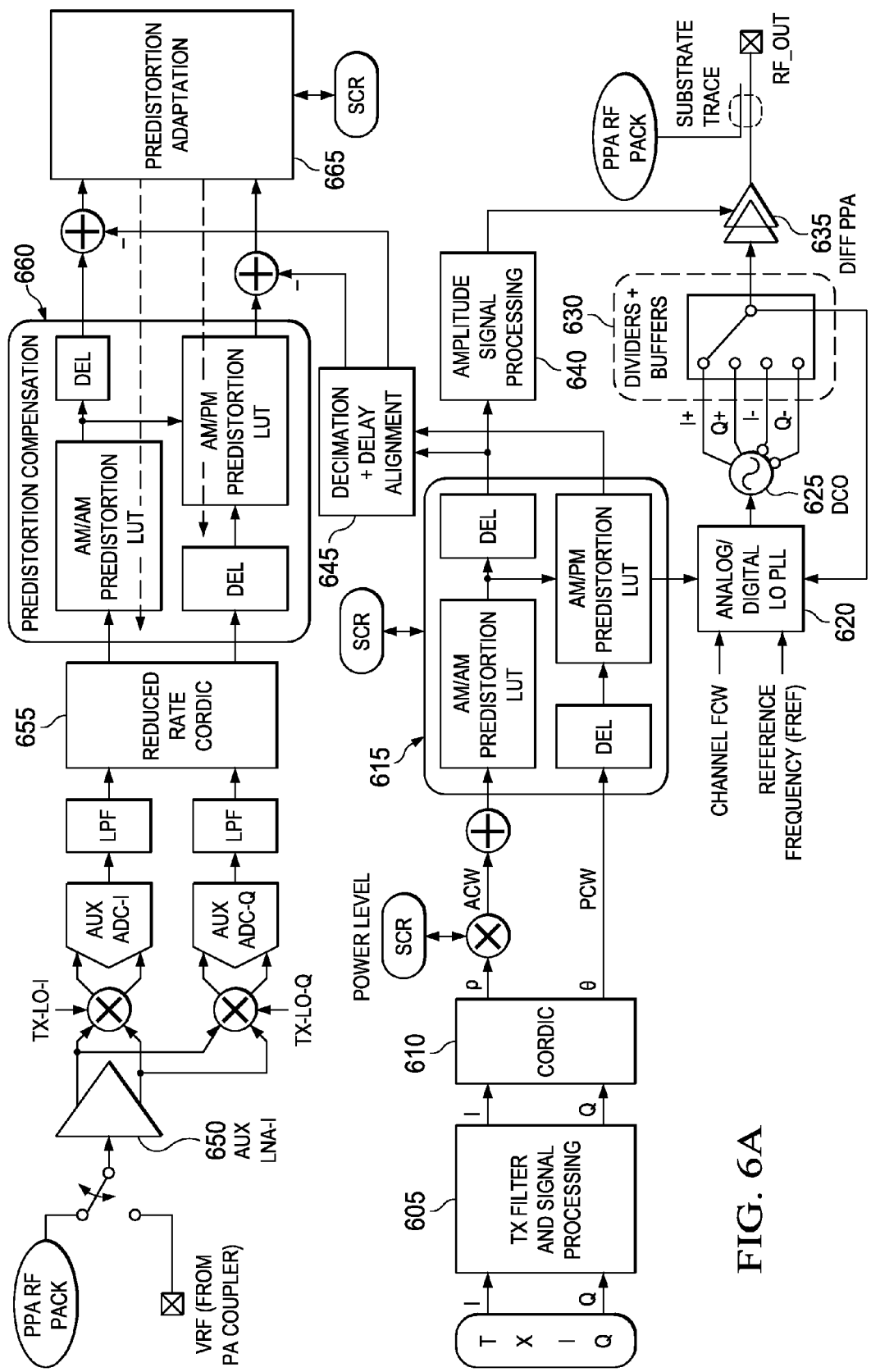
FIGS. 6A and 6B are block diagrams of an adaptive indirect closed loop predistorter in a polar 3G WCDMA transmitter and a Cartesian 3G WCDMA transmitter, respectively.
Figure 6B:
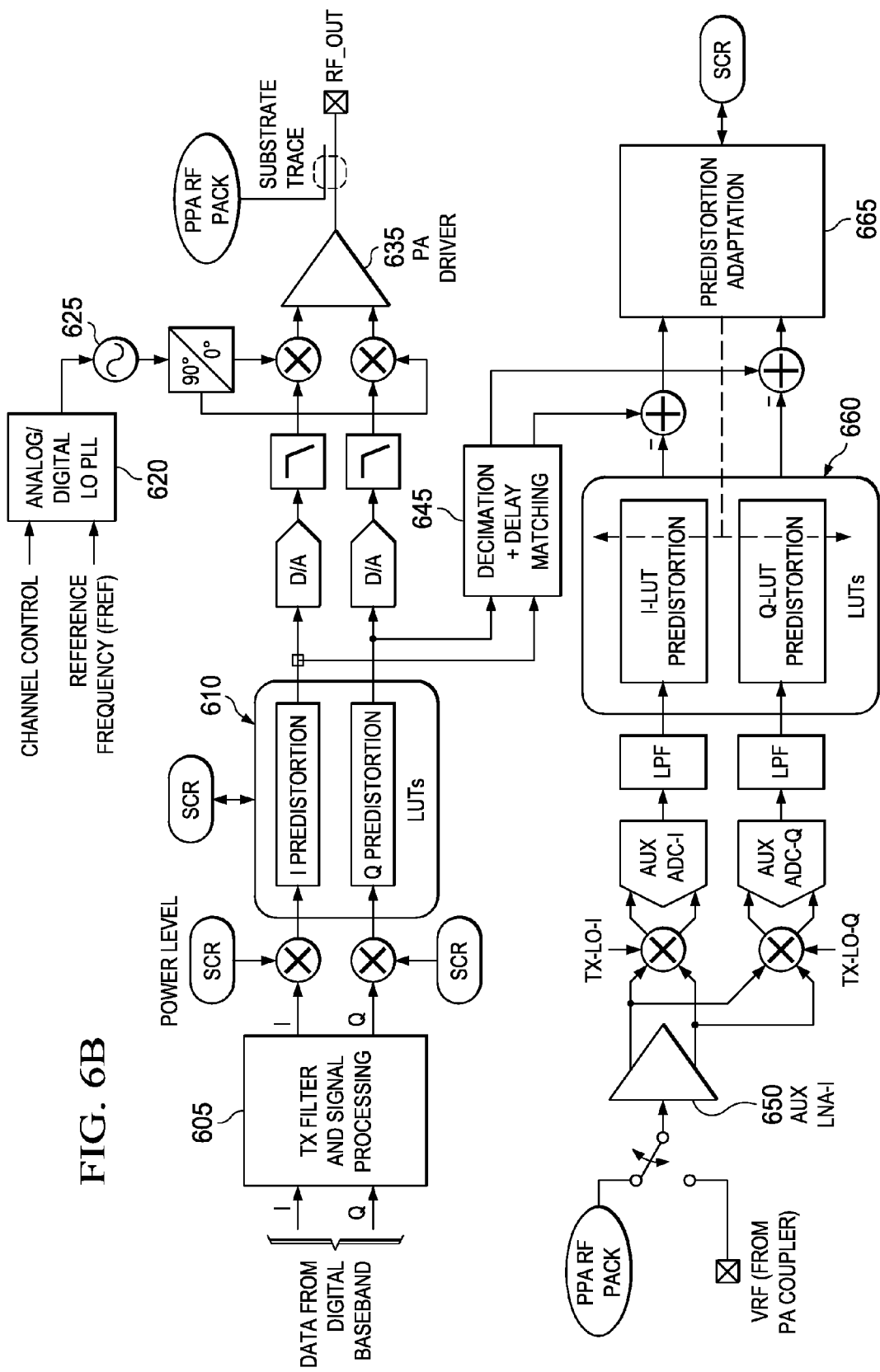

An adaptive predistorter suitable for use with a 3G WCDMA transmitter will now be described. FIGS. 6A and 6B are block diagrams of an adaptive indirect closed loop predistorter in a polar 3G WCDMA transmitter and a Cartesian 3G WCDMA transmitter, respectively.

In FIG. 6A, a digital baseband processor TXIQ produces in-phase and quadrature components I and Q. A signal processor 605 conditions I and Q for amplification. A COordinate Rotation DIgital Computer (CORDIC) 610 rotates I and Q to yield amplitude and phase components ρ and θ. First polar predistortion LUTs 140 (having four LUTs—two calibration LUTs and two compensation LUTs—in the illustrated embodiment) are employed as they were in FIG. 2 to produce predistorted amplitude and phase components $\rho_a$ and $\theta_a$. $\theta_a$ is provided to a local oscillator (LO) phase-locked loop (PLL) 160, which drives a digitally controlled oscillator (DCO) 165. Dividers and buffers 630 receive, divide and delay differential I and Q clock signals, which are used to drive the PPA 170. $\rho_a$ is provided to the amplitude signal processor 175, which the PPA 170 amplifies. The PA, which FIG. 6A does not show, yields the WCDMA output signal ($v_o$ of FIG. 2). $\rho_a$ and $\theta_a$ are also provided to a decimator and aligner 645 to be used in temperature adaptation, which will now be described.

A coupler (not referenced) provides a portion of $v_o$ to the input of an auxiliary receiver. The auxiliary receiver employs a low-noise amplifier (LNA) 650 to yield in-phase and quadrature components I and Q of $v_o$, which are downconverted, converted to digital form and filtered as shown and then rotated by another CORDIC 655 into amplitude and phase components ρ and θ. Second polar predistortion LUTs 660 (having four LUTs—two calibration LUTs and two compensation LUTs—in the illustrated embodiment) predistort ρ and θ to yield amplitude and phase components. The differences between these amplitude and phase components and those provided via the decimator and aligner 645 are provided to a predistortion adapter 665 which updates predistortion in the compensation LUTs of the second polar predistortion LUTs 660. The second polar predistortion LUTs 660 are then exchanged with the first polar predistortion LUTs 140 for the next lookup. The first polar predistortion LUTs 660 are updated during that next lookup, the first and second polar predistortion LUTs 140, 660 are exchanged again for the lookup after that, and so on.

In FIG. 6B, the digital baseband processor TXIQ again produces in-phase and quadrature components I and Q. The signal processor 605 again conditions I and Q for amplification. Cartesian predistortion LUTs 610 (having four LUTs—two calibration LUTs and two compensation LUTs—in the illustrated embodiment) are employed to produce predistorted amplitude and phase components $I_a$ and $Q_a$. $I_a$ and $Q_a$ are converted to analog form, filtered and modulated as shown and provided to the PPA 635, yielding the WCDMA output signal, $v_o$. $I_a$ and $Q_a$ are also provided to the decimator and aligner 645 to be used in temperature adaptation.

A coupler (not referenced) provides a portion of the WCDMA output signal to the input of an auxiliary receiver. The auxiliary receiver employs the LNA 650 to yield in-phase and quadrature components I and Q of the WCDMA output signal, which are downconverted, converted to digital form and filtered as shown. Second Cartesian predistortion LUTs 660 (having four LUTs—two calibration LUTs and two compensation LUTs—in the illustrated embodiment) predistort I and Q. The differences between these amplitude and phase components and those provided via the decimator and aligner 645 are provided to a predistortion adapter 665 which updates predistortion in the compensation LUTs of the second Cartesian predistortion LUTs 660. The second Cartesian predistortion LUTs 660 are then exchanged with the first Cartesian predistortion LUTs 140 for the next lookup. The first Cartesian predistortion LUTs 660 are updated during that next lookup, the first and second Cartesian predistortion LUTs 140, 660 are exchanged again for the lookup after that, and so on.

Figure 6C:
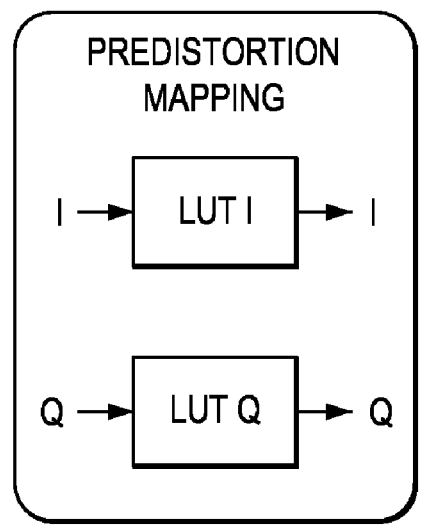
FIGS. 6C and 6D are block diagrams respectively showing direct-mapping predistortion and complex gain predistortion.
Figure 6D:
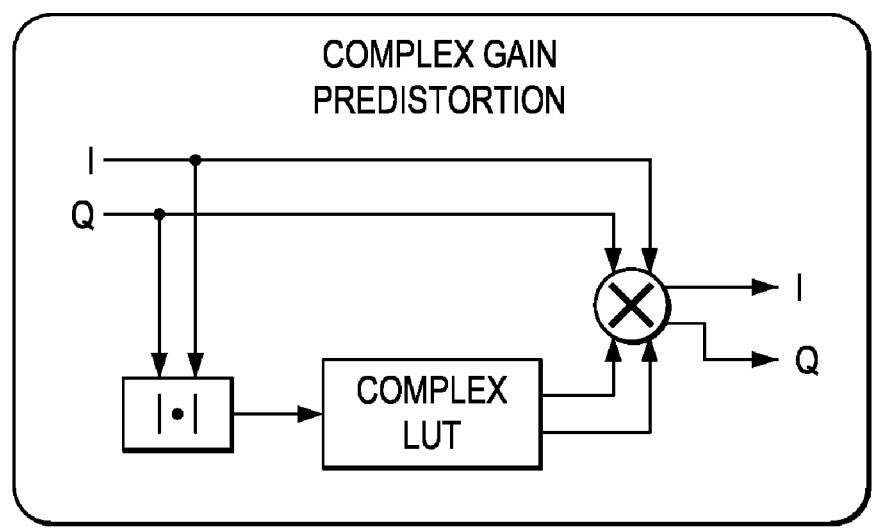

FIGS. 6C and 6D are block diagrams respectively showing direct-mapping predistortion and complex gain predistortion. In FIG. 6B, predistortion may be carried out using either direct-mapping predistortion or complex gain predistortion.

In both FIGS. 6A and 6B, the predistorter employs an auxiliary receiver that feeds back a portion of the transmitted WCDMA signal. The predistorter includes a static correction calibrated for nominal temperature operation and an adaptive compensation that tracks the characteristics variations due to temperature fluctuations. Both the calibrated and compensated portions of the predistorter are implemented using LUTs.

5. Predistortion Implementation Details

Architectural details of one embodiment of a predistorter will now be set forth, including the effects of LUT size, spacing and interpolation order. For purposes of the discussion, although linear spacing and other nonlinear spacing, e.g., A-law, are within the scope of the invention, nonlinear μ-law spacing will be adopted as the LUT spacing technique. Also, second-order interpolation will be assumed, although other orders of interpolation are within the scope of the invention.

5.2. LUT Size/Spacing Selection

The required LUT size for acceptable predistorter performance across all power levels depends on the spacing of the LUT as well as the interpolation order. Only first-order interpolation will be described in this section, with the understanding that interpolations of all order are within the scope of the invention. The effect of LUT interpolation order is described in Section 5.1, below. Uniform spacing results in poor performance at low power levels for reasonably sized LUT.

Figure 7:
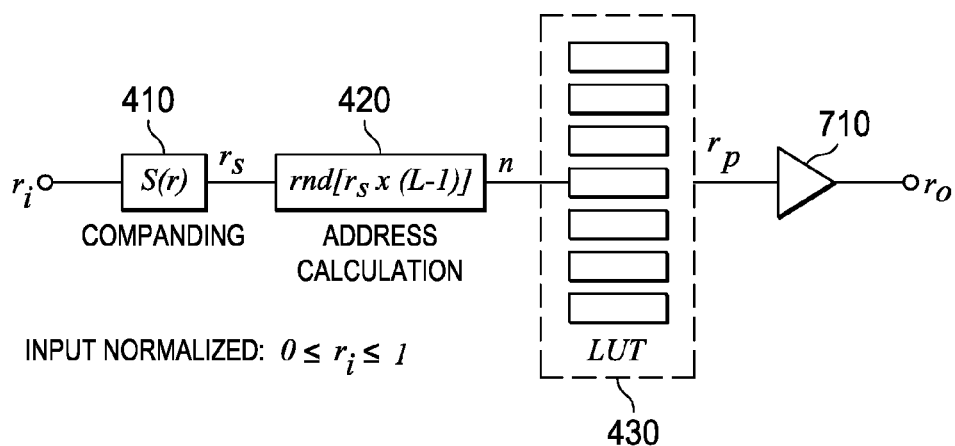
FIG. 7 is a high-level schematic diagram showing nonuniform LUT spacing using a companding function and subsequent amplification.

Nonuniform spacing can be achieved by using a companding function which maps uniformly spaced entries $\tilde{r}_k$ to a set of adequately spaced entries $r_k$. This is illustrated in FIG. 7, which includes an amplifier 710 as its nonlinear element.

Assuming that the input amplitude is normalized to one, the uniformly spaced entries for LUT of size L are given by:

$$\tilde{r}_k = \frac{k}{L-1} \quad k \in \{0, 1, \ldots, L-1\} \tag{14}$$

The corresponding nonuniformly spaced entries are $r_k = S^{-1}(\tilde{r}_k)$.

For a given companding function S(r) the width of the $k^{th}$ LUT interval is given by:

$$d_k \approx \frac{1}{L \times S'(r_k)} \quad k \in \{0, 1, \ldots, L-1\} \tag{15}$$

The theoretically optimal companding function that yields constant SNR across all power level depends on the transmitter's nonlinearity as well as the modulated signal's statistics. If an interpolated LUT of size 128 or greater is used, this optimal can be approached by using μ-law spacing or power spacing.

μ-Law Spacing:

Equation (16) gives the companding function for μ-law spacing:

$$S(r) = \frac{\ln(1 + \mu \times r)}{\ln(1 + \mu)} \tag{16}$$

The parameter μ can be adjusted for the desired dynamic range. For WCDMA, a value of 32 was chosen. The width of the $k^{th}$ LUT interval is given by:

$$d_k = \frac{1}{L \times S'(r_k)} \tag{17}$$
$$= \frac{\ln(1+\mu)}{L}(1 + \mu \times r_k)$$
$$= \frac{\ln(1+\mu)}{L}(1 + \mu)^{k/L-1}.$$

From Equation (17), it is apparent that bin width increases linearly with respect to the amplitude and exponentially with respect to the bin index k.

Power Spacing:

Equation (16) gives the companding function for power spacing:

$$S(r) = r^p \tag{18}$$

The parameter p should be chosen between ½ and ¼. The resulting bin widths can be calculated as shown above.

For p=½ the bin width is given by:

$$d_k = \frac{2k}{L(L-1)} \quad (19)$$

In this case, the bin width increases linearly with respect to the bin index k. It is noted that:

$$\sum_{K=1}^{L-1} d_k = 1 \quad (20)$$

The μ-law spacing and power spacing result in similar predistorter performance. Different embodiments are appropriate to different applications and different complexities.

Figure 8A:
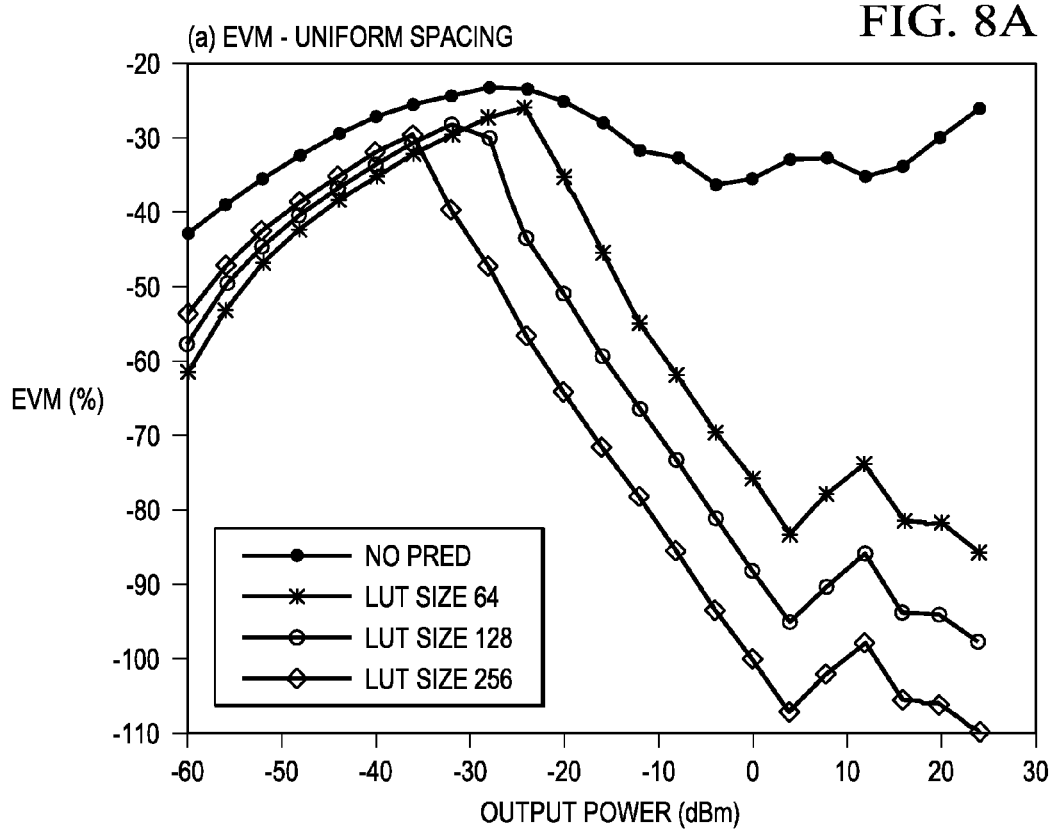
FIGS. 8A and 8B are plots showing the effect of LUT size and spacing on EVM using uniform and μ-law spacing, respectively.
Figure 8B:
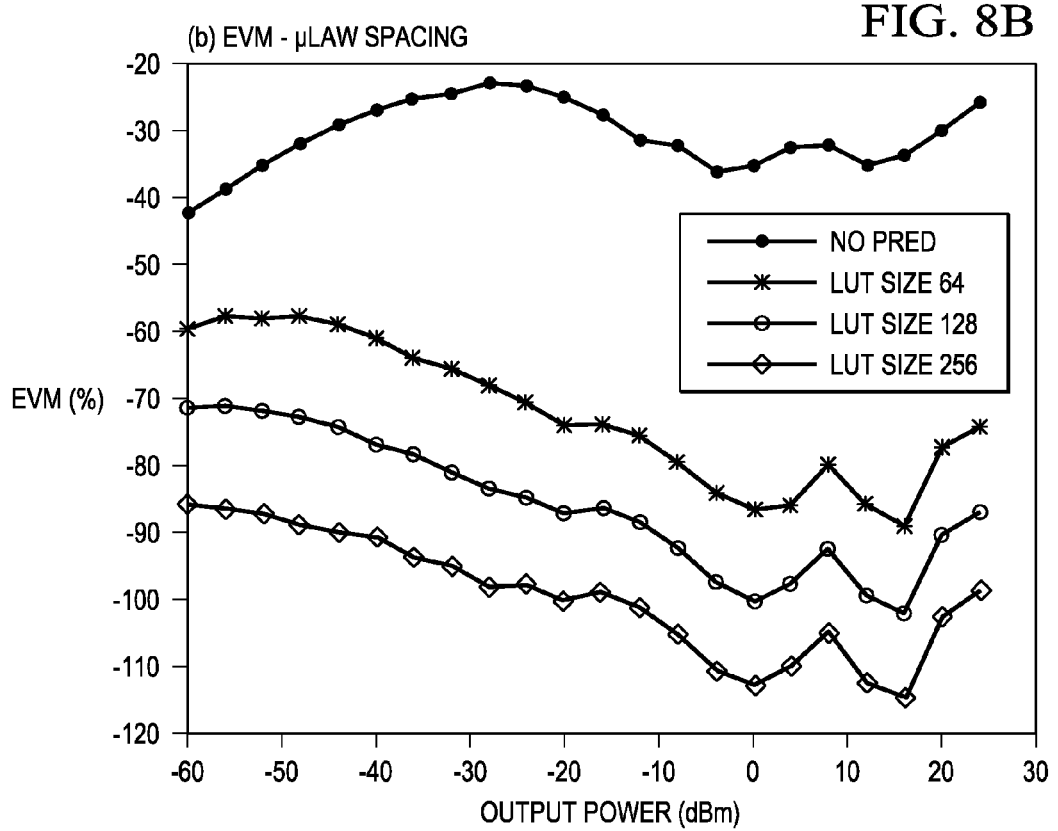
Figure 9A:
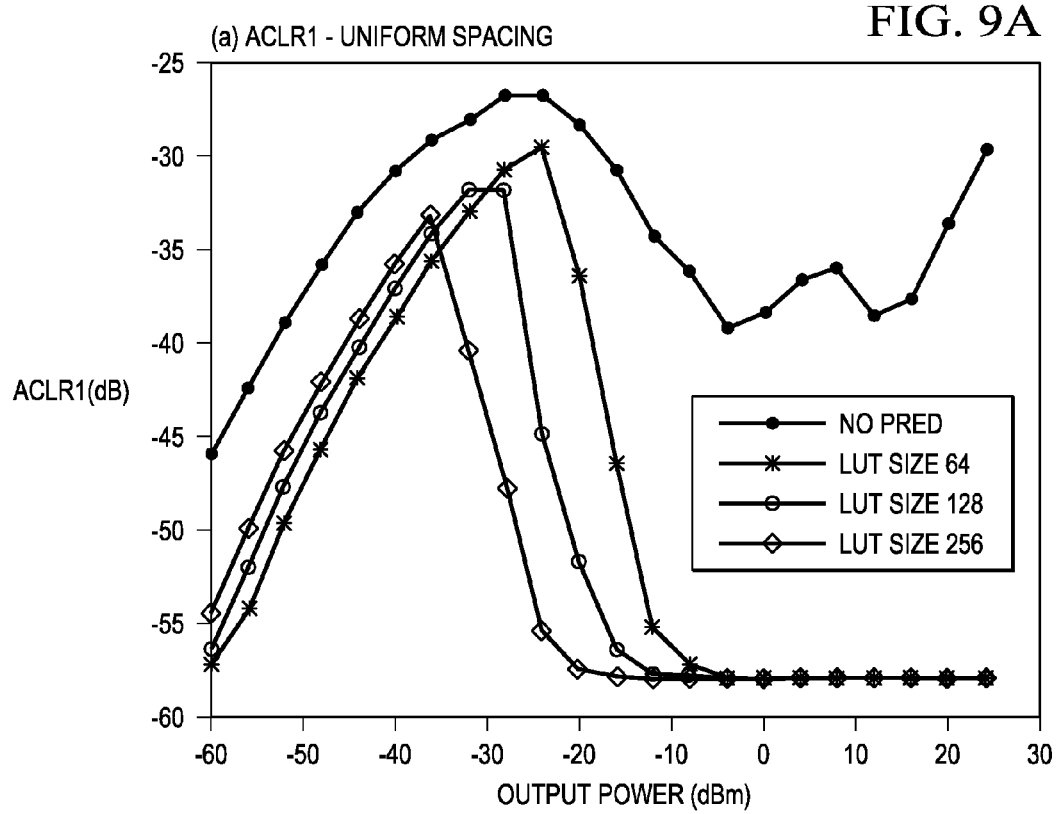
FIGS. 9A and 9B are plots showing the effect of LUT size and spacing on ACLR1 using uniform and μ-law spacing, respectively.
Figure 9B:
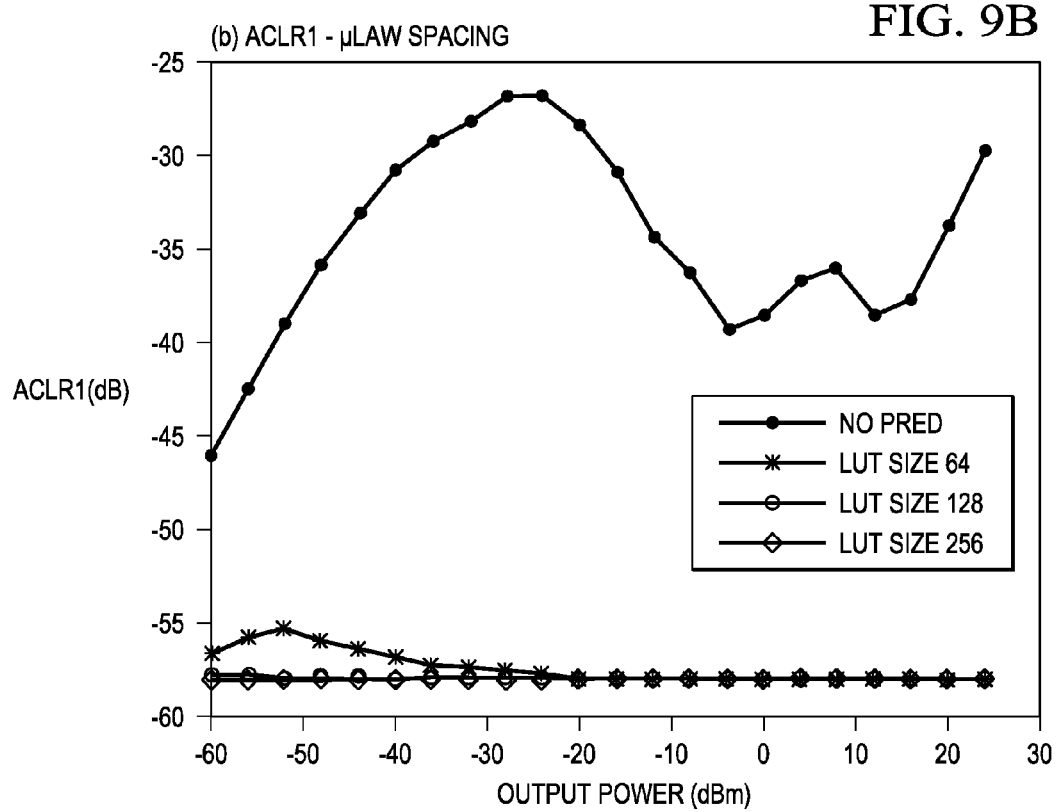
Figure 10A:
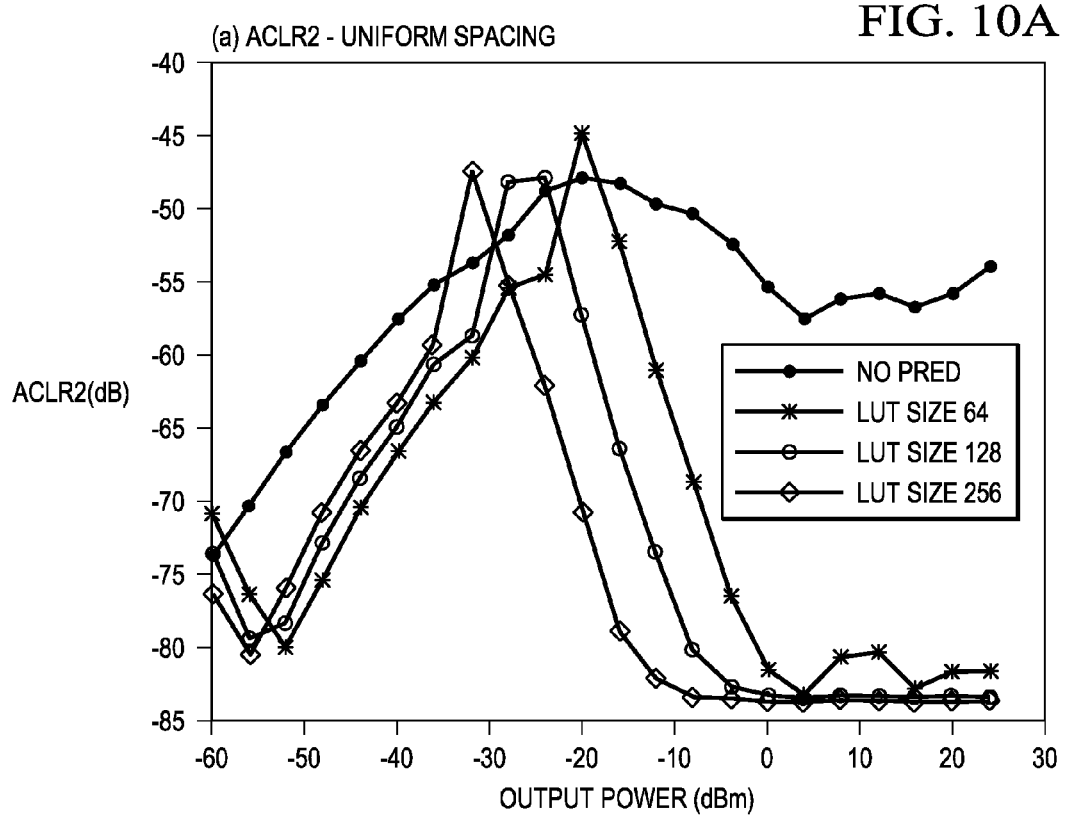
FIGS. 10A and 10B are plots showing the effect of LUT size and spacing on ACLR2 using uniform and μ-law spacing, respectively.
Figure 10B:
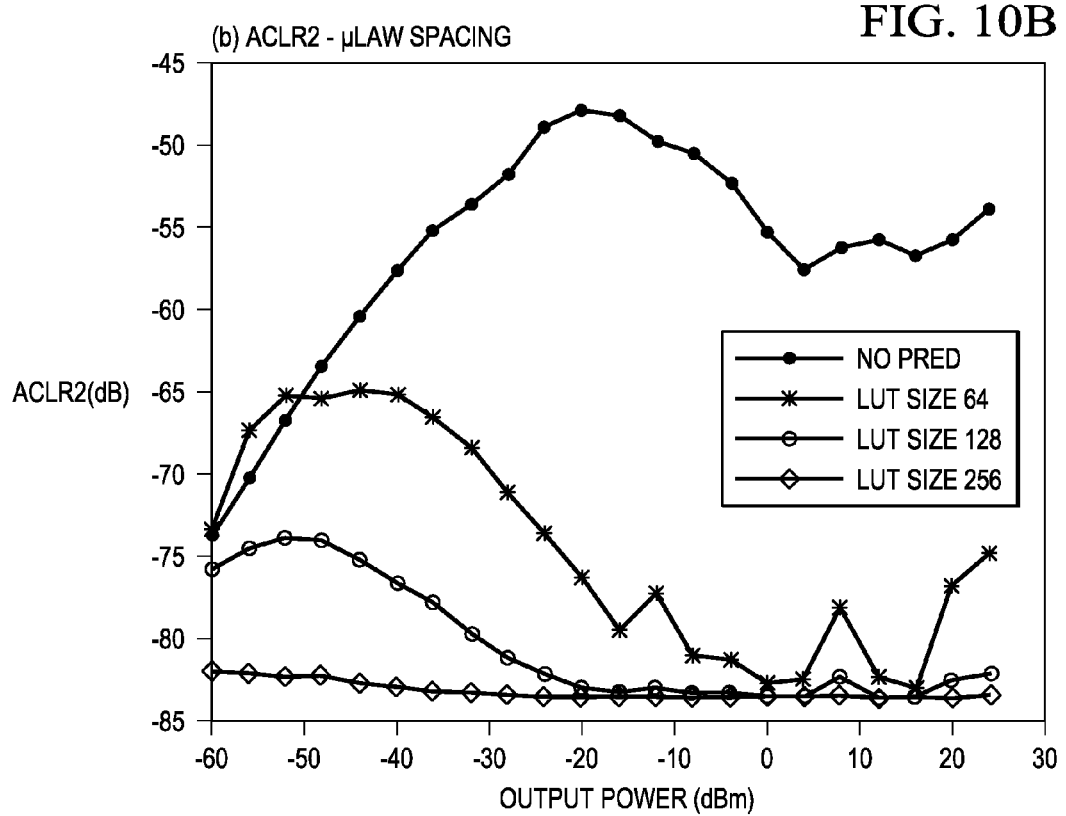

FIGS. 8A and 8B are plots showing the effect of LUT size and spacing on EVM using uniform and μ-law spacing, respectively. FIGS. 9A and 9B are plots showing the effect of LUT size and spacing on ACLR1 using uniform and μ-law spacing, respectively. FIGS. 10A and 11B are plots showing the effect of LUT size and spacing on ACLR2 using uniform and μ-law spacing, respectively. The power spacing is compared to uniform for three LUT sizes (64, 128 and 256). The transmitter's output power is varied from −20 dBm to 24 dBm. A 128-entry LUT predistorter with power spacing effectively mitigates transmitter nonlinear effects even at very low output power. A larger size (e.g., 1024) may be required for a uniformly spaced LUT predistorter at output power lower than −40 dBm.

5.3. Nonuniform, Base-2 LUT Spacing

μ-law spacing results in good predistorter performance across all power levels. In some applications, however, the computational complexity of its LUT address calculation (particularly calculating the logarithm) precludes its use. An alternative, lower complexity spacing technique will now be described. This spacing technique is designed to: (1) approach the performance of constant SNR spacing closely, (2) allow relatively fast address calculation and (3) simplify linear interpolation.

For an LUT size L, the proposed spacing divides the signal range into N intervals of exponentially increasing width. The base-2 exponential is chosen for implementation efficiency. Let $W_k$ be the width of the $k^{th}$ interval with k={0, 1, ..., N−1}.

$$W_k = \alpha \times 2^k \quad (21)$$

Each interval contains exactly M uniformly spaced entries, viz., $$M = \frac{L}{N}.$$

L, M and N should be powers of two, but do not need to be. In one example, the best performance across power levels has been achieved with N=8 and M=16 for an LUT size of L=128.

The amplitude signal's resolution should be at least N+log$_2$(M)−1 bits. Therefore for L=128 and N=8 the amplitude's resolution should be at least 11 bits. This new spacing technique will designated as the base-2 spacing in the following.

5.3.1. Example Implementation of Base-2 Spacing

For purposes of this discussion, an amplitude resolution of 12 bits will be considered. The binary representation of the amplitude signal is ($b_{11}b_{10}b_9b_8b_7b_6b_5b_4b_3b_2b_1b_0$). The LUT is addressed by log$_2$(N)=7 bits ($a_6a_5a_4a_3a_2a_1a_0$). The objective is to map the amplitude bits $b_k$ nonlinearly to the address bits $a_k$.

Figure 11:
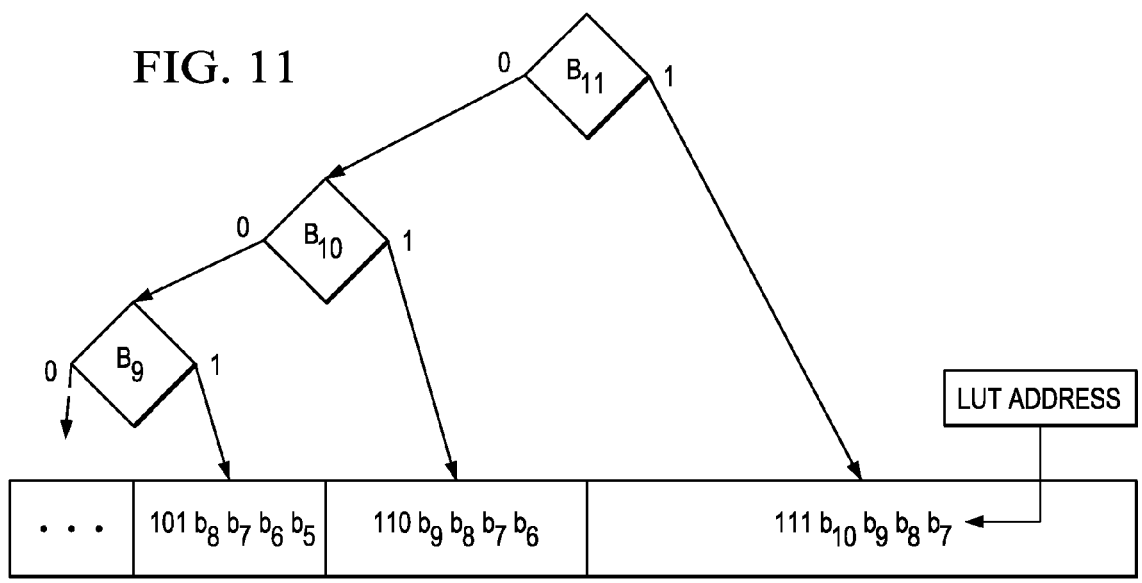
FIG. 11 is schematic diagram graphically illustrating one embodiment of an LUT entry address calculation technique.

The position of the most significant nonzero bit (if any) among the N−1=7 left-most bits determines one of the N=8 intervals. The interval number determines the first log$_2$(N)=3 bits of the LUT address ($a_6a_5a_4$). The remaining address-bits ($a_3a_2a_1a_0$) are equal to the log$_2$(M)=4 amplitude bits immediately following the most significant nonzero bit among the seven left-most bits. If the first seven bits are all equal to zero, then ($a_3a_2a_1a_0$)=($b_4b_3b_2b_1$), and the corresponding interval number is 0: ($a_6a_5a_4$)="000." It should be noted that the first two intervals are of equal width. FIG. 11 is schematic diagram graphically illustrating one embodiment of an LUT entry address calculation technique.

Table 1, below, shows amplitude entries and bin widths for each interval.

TABLE 1

LUT Amplitude Entries

| Interval | Amplitude Entries | Bin Width |
|---|---|---|
| 0 | 0, 2, 4, 6, ..., 30 | 2 |
| 1 | 32, 34, 36, 38, ..., 62 | 2 |
| 2 | 64, 68, 72, 76, ..., 124 | 4 |
| 3 | 128, 136, 144, 152, ..., 248 | 8 |
| 4 | 256, 272, 288, 304, ..., 496 | 16 |
| 5 | 512, 544, 576, 608, ..., 992 | 32 |
| 6 | 1024, 1088, 1152, 1216, ..., 1984 | 64 |
| 7 | 2048, 2176, 2304, 2432, ..., 3968 | 128 |

Figure 12:
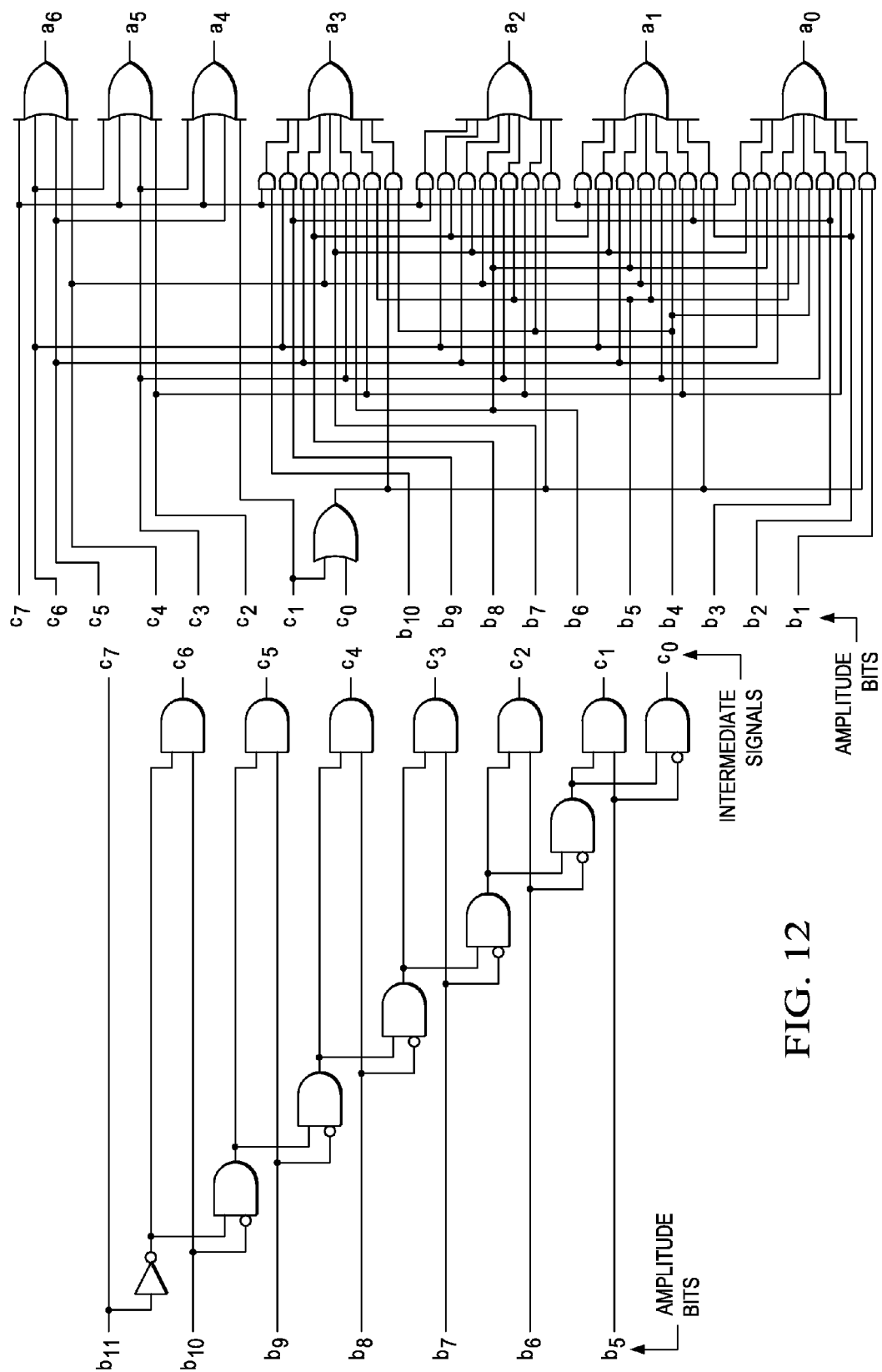
FIG. 12 is a schematic diagram of one embodiment of an address calculation circuit.
Figure 13:
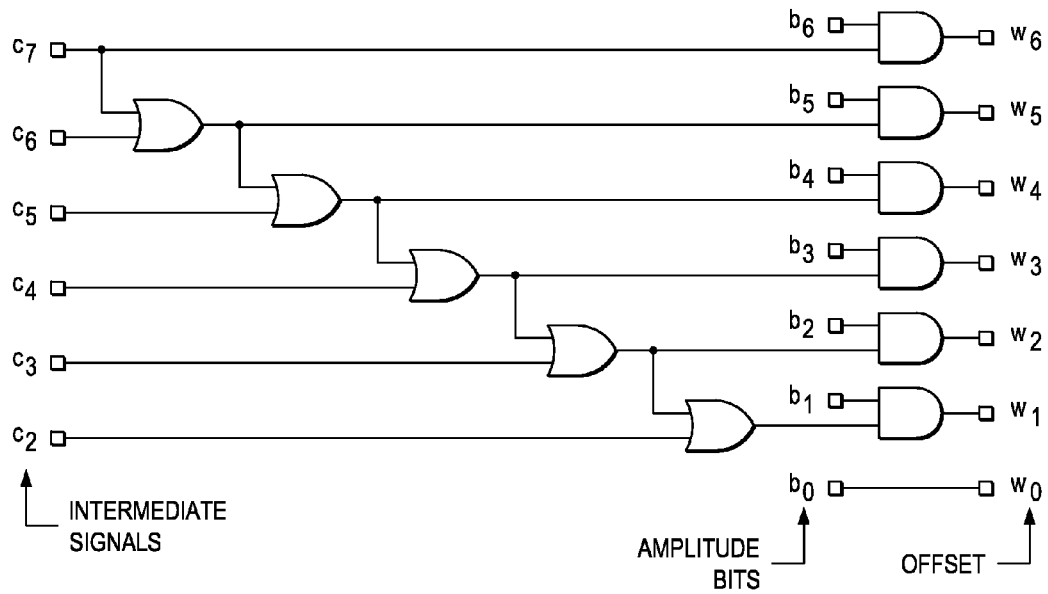
FIG. 13 is a schematic diagram of one embodiment of an interpolation offset calculation circuit.
Figure 14:
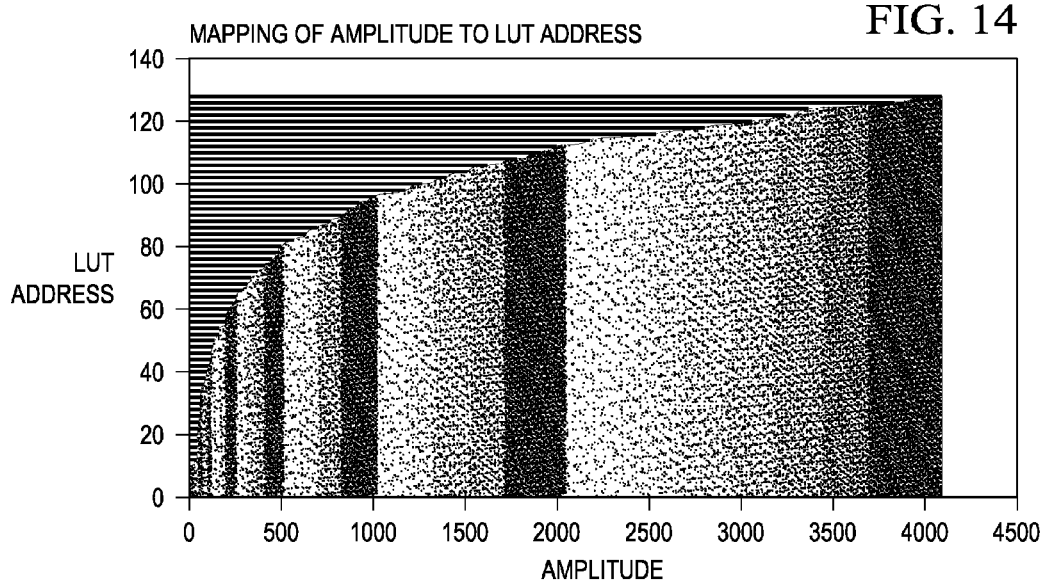
FIG. 14 is a plot showing a mapping of LUT input signal amplitudes to LUT entry addresses.

In the embodiment of Table 1, the spacing between two consecutive entries is a power of two. This facilitates linear interpolation. The calculated address corresponds to the LUT entry immediately below (or equal to) the amplitude value. The LUT address, bin width and interpolation offset can be calculated in a single clock cycle using elementary logic gates. FIG. 12 is a schematic diagram of one embodiment of an address calculation circuit employing elementary logic gates, and FIG. 13 is a schematic diagram of one embodiment of an interpolation offset calculation circuit, also employing elementary logic gates. The operation of these circuits will now be described.

5.3.1.1. Address Calculation in Base-2 Spacing

The LUT address is calculated by deriving a nonlinear mapping between the amplitude bits $b_k$ and address bits $a_k$. Table 2, below, shows the truth table for this calculation.

TABLE 2

LUT Address Calculation

| $b_{11}$ | $b_{10}$ | $b_9$ | $b_8$ | $b_7$ | $b_6$ | $b_5$ | $b_4$ | $b_3$ | $b_2$ | $b_1$ | $b_0$ | $a_0$ | $a_0$ | $a_0$ | $a_0$ | $a_0$ | $a_0$ | $a_0$ |
|---|---|---|---|---|---|---|---|---|---|---|---|---|---|---|---|---|---|---|
| 1 | X | X | X | X | X | X | x | x | x | x | x | 1 | 1 | 1 | $b_{10}$ | $b_9$ | $b_8$ | $b_7$ |
| 0 | 1 | X | X | X | X | X | x | x | x | x | x | 1 | 1 | 0 | $b_9$ | $b_8$ | $b_7$ | $b_6$ |
| 0 | 0 | 1 | X | X | X | X | x | x | x | x | x | 1 | 0 | 1 | $b_8$ | $b_7$ | $b_6$ | $b_5$ |
| 0 | 0 | 0 | 1 | X | X | X | x | x | x | x | x | 1 | 0 | 0 | $b_7$ | $b_6$ | $b_5$ | $b_4$ |
| 0 | 0 | 0 | 0 | 1 | X | X | x | x | x | x | x | 0 | 1 | 1 | $b_6$ | $b_5$ | $b_4$ | $b_3$ |

TABLE 2-continued

LUT Address Calculation

| $b_{11}$ | $b_{10}$ | $b_9$ | $b_8$ | $b_7$ | $b_6$ | $b_5$ | $b_4$ | $b_3$ | $b_2$ | $b_1$ | $b_0$ | $a_0$ | $a_0$ | $a_0$ | $a_0$ | $a_0$ | $a_0$ | $a_0$ |
|---|---|---|---|---|---|---|---|---|---|---|---|---|---|---|---|---|---|---|
| 0 | 0 | 0 | 0 | 0 | 1 | x | x | x | x | x | x | 0 | 1 | 0 | $b_5$ | $b_4$ | $b_3$ | $b_2$ |
| 0 | 0 | 0 | 0 | 0 | 0 | 1 | x | x | x | x | x | 0 | 0 | 1 | $b_4$ | $b_3$ | $b_2$ | $b_1$ |

The address calculation circuit of FIG. 12, which implements the truth table of Table 2, contains 81 elementary gates: 34 OR gates, 40 AND gates and 7 NOT gates.

5.3.2. LUT Interpolation in Base-2 Spacing

The address calculation unit selects the LUT entry (at address n, denoted LUT[n]) immediately below the input amplitude (or exactly equal to it). In the illustrated embodiment, only the interpolation offset, Offset, and bin width, BinWidth, are required for LUT interpolation. In an alternative embodiment, the interpolation factor (which is the ratio of offset to the bin width) is directly computed. The offset is the difference between the input amplitude, Amplitude, and the LUT entry at address n(Offset=Amplitude−LUT[n]). The interpolated LUT output is given by:

$$LUT[n] + \frac{Offset}{BinWidth} \times (LUT[n+1] - LUT[n]) \quad (22)$$

In the embodiment of Table 1, the bin width is always a power of two, which simplifies the calculation.

The bin width and offset can be calculated from the input amplitude bits and intermediate signals $c_k$. Only a few elementary logic gates are required. The LUT address, offset and bin width can be calculate during the same clock cycle.

Bin width calculation is straightforward. Bin width can be computed from the intermediate signals $c_7 c_6 \ldots c_0$ used in FIG. 12 for address calculation. The bin width varies between two and 128 and can therefore be redescribed with eight bits $d_7 d_6 \ldots d_0$, viz.: $d_7=c_7$, $d_6=c_6$, $d_5=c_5$, $d_4=c_4$, $d_3=c_3$, $d_2=c_2$, $d_1=c_1+c_0$, $d_0=0$. All the bits $d_k$ are readily available from the address calculation circuit of FIG. 12, so no additional gates or other hardware is required.

5.3.2.1. Interpolation Offset Calculation in Base-2 Spacing

The interpolation offset varies between 0 and 127, requiring seven bits ($w_6 w_5 \ldots w_0$). The interpolation offset can easily be calculated from the amplitude bits and intermediate signals $c_7 c_6 \ldots c_2$. FIG. 13 shows an example circuit for calculating the interpolation offset using elementary logic gates.

5.4. Modified Base-2 Spacing

Figure 15A:
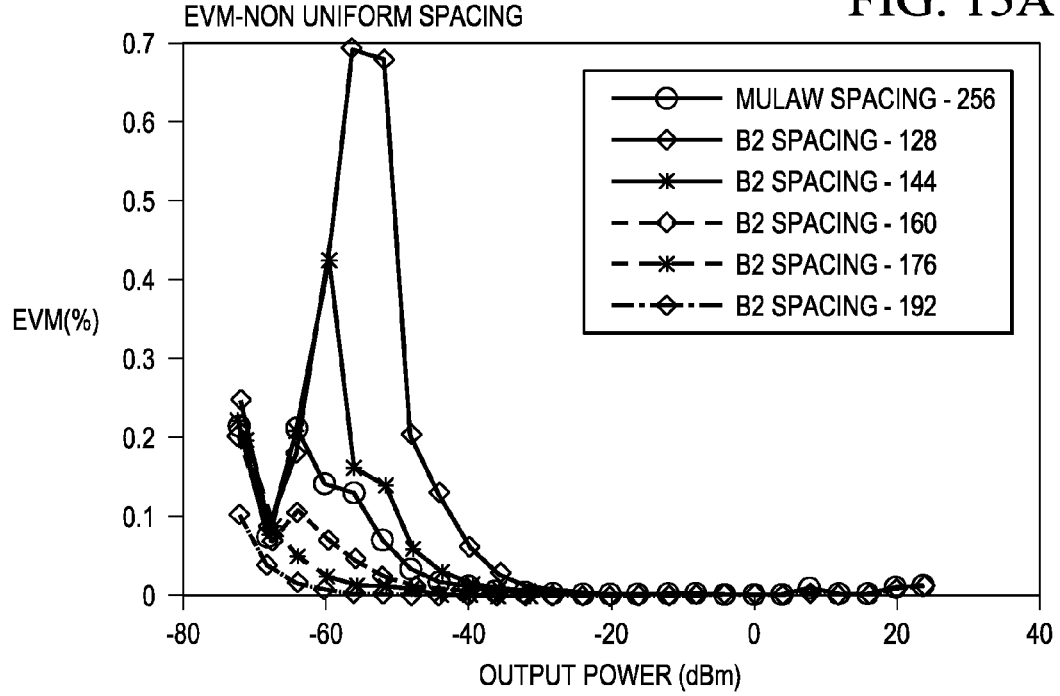
FIGS. 15A, 15B and 15C are plots showing the effect of WCDMA transmitter performance using base-2 spacing in terms of EVM, ACLR1 and ACLR2, respectively.
Figure 15B:
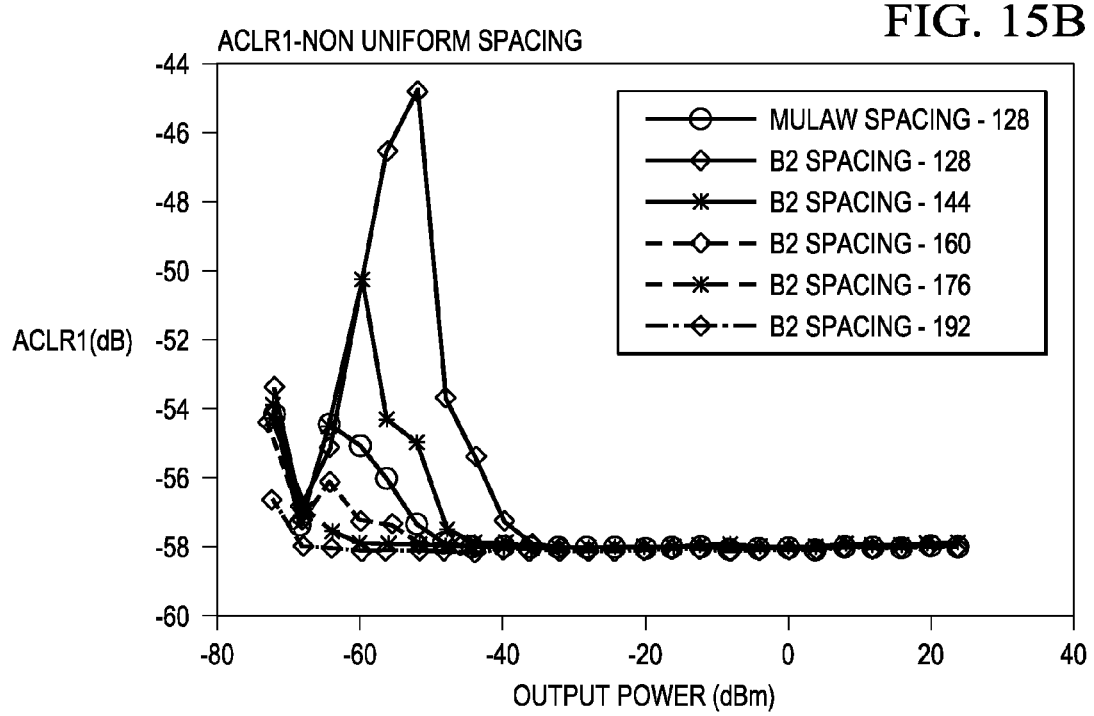
Figure 15C:
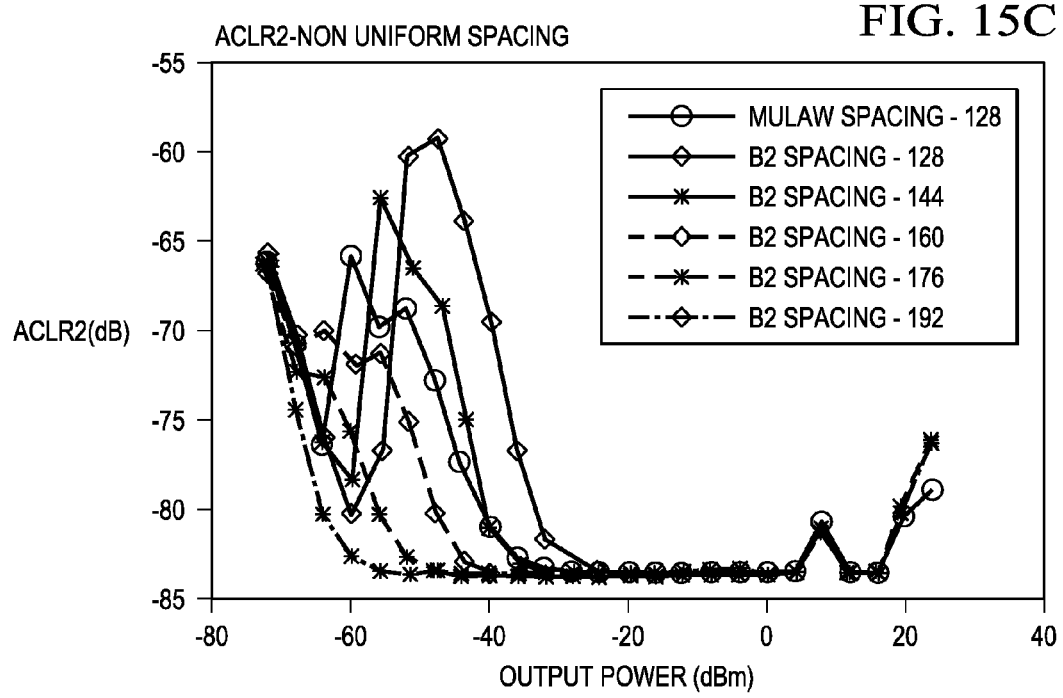
Figure 16A:
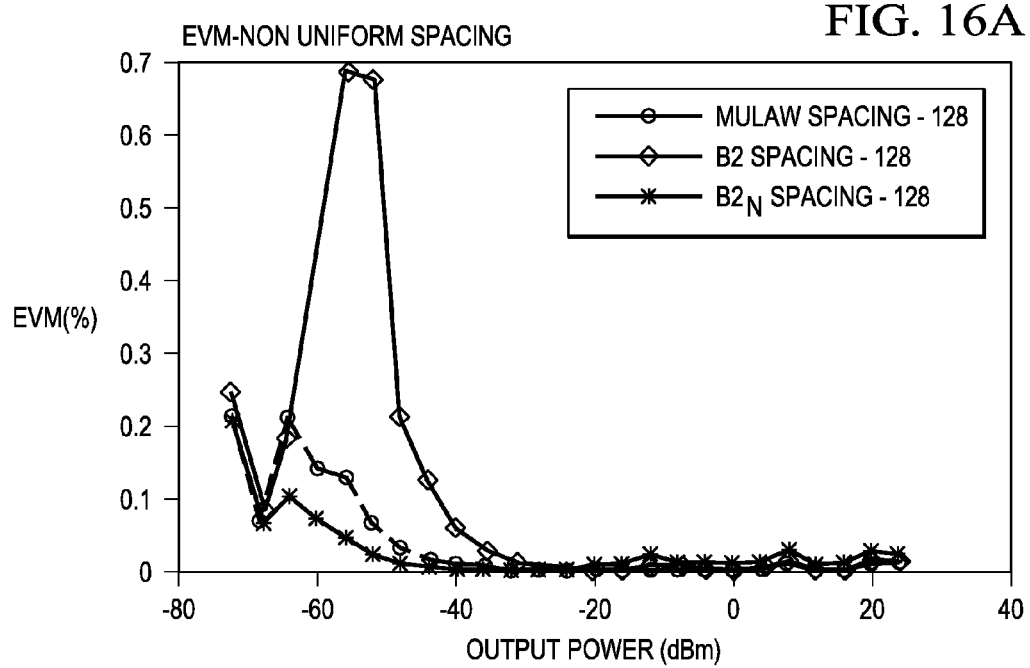
FIGS. 16A, 16B and 16C are plots showing the effect of WCDMA transmitter performance using improved base-2 spacing in terms of EVM, ACLR1 and ACLR2, respectively.
Figure 16B:
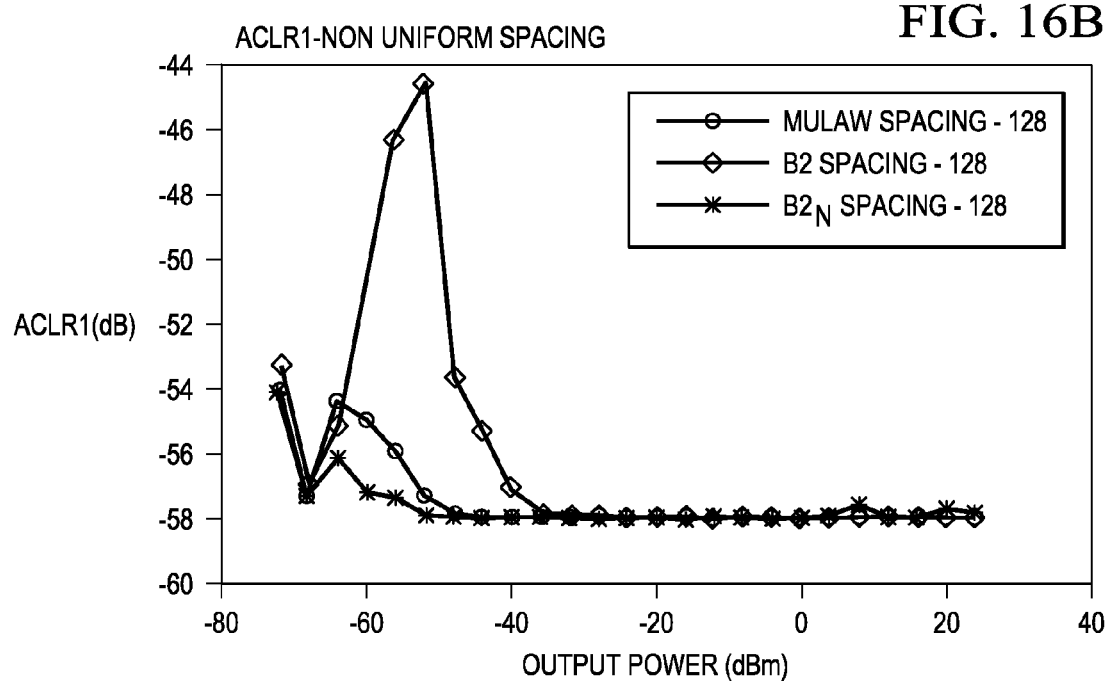
Figure 16C:
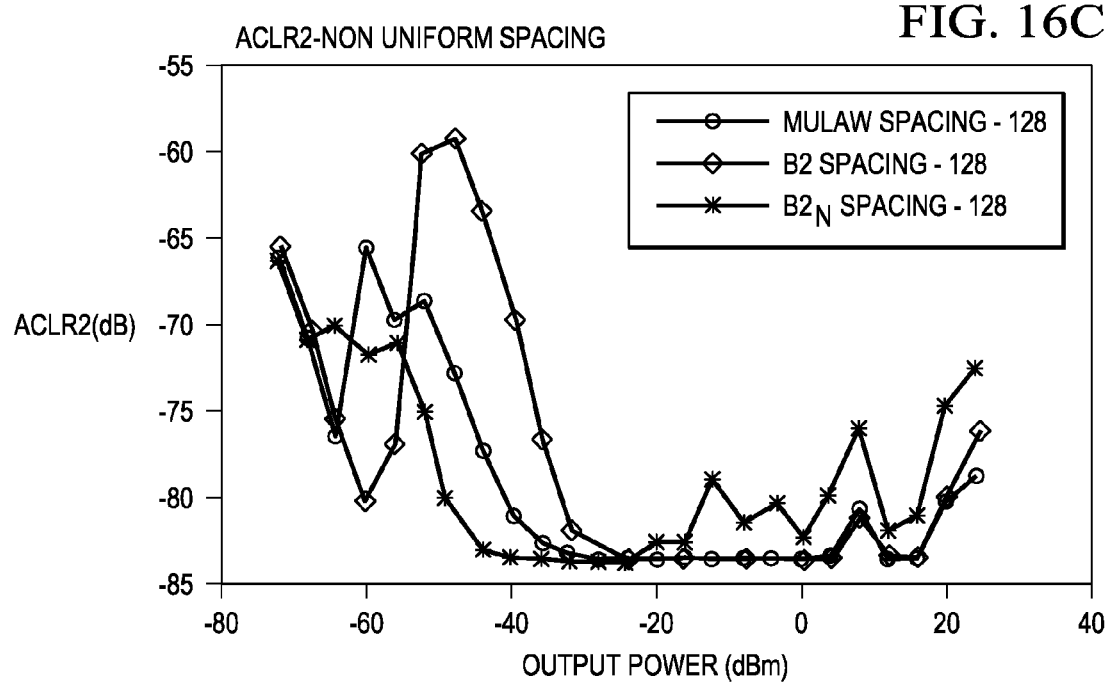

A slightly modified base-2 spacing technique may be used to improve the performance of the WCDMA transmitter below −40 dBm, as FIGS. 15A, 15B and 15C indicate may be desirable. The original goal was to satisfy specifications with a 128-entry LUT by moving additional entries from higher amplitudes to lower amplitude. To meet this end, the number of base-2 intervals is increased to ten, and the 13 most significant bits of the amplitude are used to compute the LUT address. The obtained logical structure is a little less "uniform," but achieves a significant performance improvement between −40 dB and −70 dB as FIGS. 16A, 16B and 16C show, at the cost of slightly decreased performance at highest power levels. The results are summarized below.

5.4.1. Example implementation of Modified Base-2 Spacing

The dynamic range covered by the LUT can be increasing the number of intervals and varying the number of entries per interval. In the following example, a 16-bit digital amplitude word ($b_{15} \ldots b_0$) is considered. The LUT size is still set at 128 entries. The number of intervals is set to 13. The first three intervals contain 16 entries each, and the remaining ten intervals contain eight entries each.

5.4.1.1. Address Calculation in Modified Base-2 Spacing

Table 3, below, sets how address bits ($a_6 a_5 a_4 a_3 a_2 a_1 a_0$) may be determined.

TABLE 3

LUT Address Calculation

| $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ | $a_6$ | $a_5$ | $a_4$ | $a_3$ | $a_2$ | $a_1$ | $a_0$ |
|---|---|---|---|---|---|---|---|---|---|---|---|---|---|---|---|---|---|---|---|---|---|---|
| 1 | X | X | X | X | X | X | X | X | X | X | X | X | X | X | X | 1 | 1 | 1 | $b_{14}$ | $b_{13}$ | $b_{12}$ | $b_{11}$ |
| 0 | 1 | X | X | X | X | X | X | X | X | X | X | X | X | X | X | 1 | 1 | 0 | $b_{13}$ | $b_{12}$ | $b_{11}$ | $b_{10}$ |
| 0 | 0 | 1 | X | X | X | X | X | X | X | X | X | X | X | X | X | 1 | 0 | 1 | $b_{12}$ | $b_{11}$ | $b_{10}$ | $b_9$ |
| 0 | 0 | 0 | 1 | X | X | X | X | X | X | X | X | X | X | X | X | 1 | 0 | 0 | 1 | $b_{11}$ | $b_{10}$ | $b_9$ |
| 0 | 0 | 0 | 0 | 1 | X | X | X | X | X | X | X | X | X | X | X | 1 | 0 | 0 | 0 | $b_{10}$ | $b_9$ | $b_8$ |
| 0 | 0 | 0 | 0 | 0 | 1 | X | X | X | X | X | X | X | X | X | X | 0 | 1 | 1 | 1 | $b_9$ | $b_8$ | $b_7$ |
| 0 | 0 | 0 | 0 | 0 | 0 | 1 | X | X | X | X | X | X | X | X | X | 0 | 1 | 1 | 0 | $b_8$ | $b_7$ | $b_6$ |
| 0 | 0 | 0 | 0 | 0 | 0 | 0 | 1 | X | X | X | X | X | X | X | X | 0 | 1 | 0 | 1 | $b_7$ | $b_6$ | $b_5$ |
| 0 | 0 | 0 | 0 | 0 | 0 | 0 | 0 | 1 | X | X | X | X | X | X | X | 0 | 1 | 0 | 0 | $b_6$ | $b_5$ | $b_4$ |
| 0 | 0 | 0 | 0 | 0 | 0 | 0 | 0 | 0 | 1 | X | X | X | X | X | X | 0 | 0 | 1 | 1 | $b_5$ | $b_4$ | $b_3$ |
| 0 | 0 | 0 | 0 | 0 | 0 | 0 | 0 | 0 | 0 | 1 | X | X | X | X | X | 0 | 0 | 1 | 0 | $b_4$ | $b_3$ | $b_2$ |
| 0 | 0 | 0 | 0 | 0 | 0 | 0 | 0 | 0 | 0 | 0 | 1 | X | X | X | X | 0 | 0 | 0 | 1 | $b_3$ | $b_2$ | $b_1$ |
| 0 | 0 | 0 | 0 | 0 | 0 | 0 | 0 | 0 | 0 | 0 | 0 | X | X | X | X | 0 | 0 | 0 | 0 | $b_3$ | $b_2$ | $b_1$ |

5.4.1.2. Bin Width Calculation in Modified Base-2 Spacing

The bin width varies from 8 to 211. Table 4, below, sets forth how the 12 bits of the bin width $d_{11} d_{10} \ldots d_0$ may be determined. The least-significant bits (LSBs) always equal zero.

TABLE 4

LUT Bin Width Calculation

| $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ | $d_{11}$ | $d_{10}$ | $d_9$ | $d_8$ | $d_7$ | $d_6$ | $d_5$ | $d_4$ | $d_3$ | $d_2$ | $d_1$ | $d_0$ |
|---|---|---|---|---|---|---|---|---|---|---|---|---|---|---|---|---|---|---|---|---|---|---|---|---|---|---|---|
| 1 | X | X | X | X | X | X | X | X | X | X | X | X | X | X | X | 1 | 0 | 0 | 0 | 0 | 0 | 0 | 0 | 0 | 0 | 0 | 0 |
| 0 | 1 | X | X | X | X | X | X | X | X | X | X | X | X | X | X | 0 | 1 | 0 | 0 | 0 | 0 | 0 | 0 | 0 | 0 | 0 | 0 |
| 0 | 0 | 1 | X | X | X | X | X | X | X | X | X | X | X | X | X | 0 | 0 | 1 | 0 | 0 | 0 | 0 | 0 | 0 | 0 | 0 | 0 |
| 0 | 0 | 0 | 1 | X | X | X | X | X | X | X | X | X | X | X | X | 0 | 0 | 1 | 0 | 0 | 0 | 0 | 0 | 0 | 0 | 0 | 0 |
| 0 | 0 | 0 | 0 | 1 | X | X | X | X | X | X | X | X | X | X | X | 0 | 0 | 0 | 1 | 0 | 0 | 0 | 0 | 0 | 0 | 0 | 0 |
| 0 | 0 | 0 | 0 | 0 | 1 | X | X | X | X | X | X | X | X | X | X | 0 | 0 | 0 | 0 | 1 | 0 | 0 | 0 | 0 | 0 | 0 | 0 |
| 0 | 0 | 0 | 0 | 0 | 0 | 1 | X | X | X | X | X | X | X | X | X | 0 | 0 | 0 | 0 | 0 | 1 | 0 | 0 | 0 | 0 | 0 | 0 |
| 0 | 0 | 0 | 0 | 0 | 0 | 0 | 1 | X | X | X | X | X | X | X | X | 0 | 0 | 0 | 0 | 0 | 0 | 1 | 0 | 0 | 0 | 0 | 0 |
| 0 | 0 | 0 | 0 | 0 | 0 | 0 | 0 | 1 | X | X | X | X | X | X | X | 0 | 0 | 0 | 0 | 0 | 0 | 0 | 1 | 0 | 0 | 0 | 0 |
| 0 | 0 | 0 | 0 | 0 | 0 | 0 | 0 | 0 | 1 | X | X | X | X | X | X | 0 | 0 | 0 | 0 | 0 | 0 | 0 | 0 | 1 | 0 | 0 | 0 |

5.4.1.3. Interpolation Offset in Modified Base-2 Spacing

Table 5, below, sets forth how the 11 bits of the interpolation offset $w_{10} w_9 \ldots w_0$ may be determined.

TABLE 5

LUT Interpolation Offset Calculation

| $b_{15}$ | $b_{14}$ | $b_{13}$ | $b_{12}$ | $b_{11}$ | $b_{10}$ | $b_9$ | $b_8$ | $b_7$ | $b_6$ | $b_5$ | $b_4$ | $b_3$ | $b_2$ | $b_1$ | $b_0$ | $w_{10}$ | $w_9$ | $w_8$ | $w_7$ | $w_6$ | $w_5$ | $w_4$ | $w_3$ | $w_2$ | $w_1$ | $w_0$ |
|---|---|---|---|---|---|---|---|---|---|---|---|---|---|---|---|---|---|---|---|---|---|---|---|---|---|---|
| 1 | X | X | X | X | X | X | X | X | X | X | X | X | X | X | X | $b_{10}$ | $b_9$ | $b_8$ | $b_7$ | $b_6$ | $b_5$ | $b_4$ | $b_3$ | $b_2$ | $b_1$ | $b_0$ |
| 0 | 1 | X | X | X | X | X | X | X | X | X | X | X | X | X | X | 0 | $b_9$ | $b_8$ | $b_7$ | $b_6$ | $b_5$ | $b_4$ | $b_3$ | $b_2$ | $b_1$ | $b_0$ |
| 0 | 0 | 1 | X | X | X | X | X | X | X | X | X | X | X | X | X | 0 | 0 | $b_8$ | $b_7$ | $b_6$ | $b_5$ | $b_4$ | $b_3$ | $b_2$ | $b_1$ | $b_0$ |
| 0 | 0 | 0 | 1 | X | X | X | X | X | X | X | X | X | X | X | X | 0 | 0 | $b_8$ | $b_7$ | $b_6$ | $b_5$ | $b_4$ | $b_3$ | $b_2$ | $b_1$ | $b_0$ |
| 0 | 0 | 0 | 0 | 1 | X | X | X | X | X | X | X | X | X | X | X | 0 | 0 | 0 | $b_7$ | $b_6$ | $b_5$ | $b_4$ | $b_3$ | $b_2$ | $b_1$ | $b_0$ |
| 0 | 0 | 0 | 0 | 0 | 1 | X | X | X | X | X | X | X | X | X | X | 0 | 0 | 0 | 0 | $b_6$ | $b_5$ | $b_4$ | $b_3$ | $b_2$ | $b_1$ | $b_0$ |
| 0 | 0 | 0 | 0 | 0 | 0 | 1 | X | X | X | X | X | X | X | X | X | 0 | 0 | 0 | 0 | 0 | $b_5$ | $b_4$ | $b_3$ | $b_2$ | $b_1$ | $b_0$ |
| 0 | 0 | 0 | 0 | 0 | 0 | 0 | 1 | X | X | X | X | X | X | X | X | 0 | 0 | 0 | 0 | 0 | 0 | $b_4$ | $b_3$ | $b_2$ | $b_1$ | $b_0$ |
| 0 | 0 | 0 | 0 | 0 | 0 | 0 | 0 | 1 | X | X | X | X | X | X | X | 0 | 0 | 0 | 0 | 0 | 0 | 0 | $b_3$ | $b_2$ | $b_1$ | $b_0$ |
| 0 | 0 | 0 | 0 | 0 | 0 | 0 | 0 | 0 | 1 | X | X | X | X | X | X | 0 | 0 | 0 | 0 | 0 | 0 | 0 | 0 | $b_2$ | $b_1$ | $b_0$ |
| 0 | 0 | 0 | 0 | 0 | 0 | 0 | 0 | 0 | 0 | 1 | X | X | X | X | X | 0 | 0 | 0 | 0 | 0 | 0 | 0 | 0 | 0 | $b_1$ | $b_0$ |
| 0 | 0 | 0 | 0 | 0 | 0 | 0 | 0 | 0 | 0 | 0 | 1 | X | X | X | X | 0 | 0 | 0 | 0 | 0 | 0 | 0 | 0 | 0 | 0 | $b_0$ |
| 0 | 0 | 0 | 0 | 0 | 0 | 0 | 0 | 0 | 0 | 0 | 0 | X | X | X | X | 0 | 0 | 0 | 0 | 0 | 0 | 0 | 0 | 0 | 0 | $b_0$ |

6. LUT Mapping for Improved Accuracy Under Large Signal Dynamic Range

For signals with large dynamic range, such as a WCDMA amplitude (which has a dynamic range in excess of 110 dB), managing the LUT mapping quantization floor is a daunting task. In this section, only LUTs that use nonlinear spacing for the index lookup process described above will be considered. Linear spacing falls within the scope of the invention, but will not be considered here due to its relatively inferior performance for the input signal dynamic range. The only explored quantity is the number of bits used for each LUT entry, which defines the dynamic range of the LUT output.

6.1 Direct Mapping

Figure 17A:
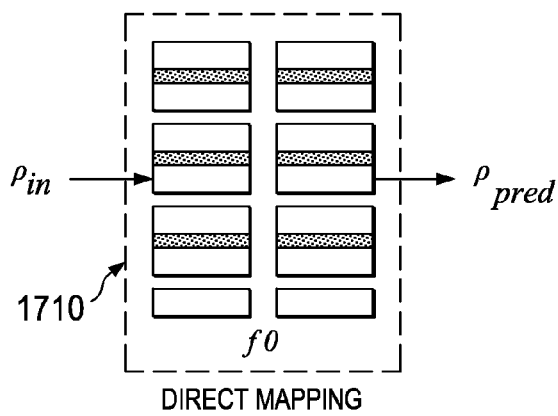
FIGS. 17A and 17B are high-level schematic diagrams showing direct mapping and inverse gain configurations, respectively.
Figure 17B:
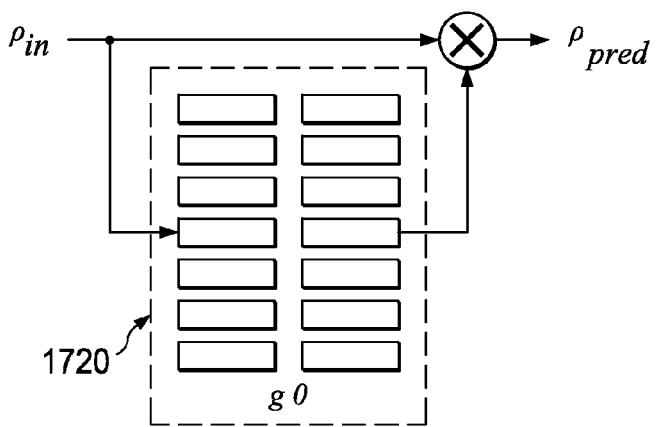

FIGS. 17A and 17B are high-level schematic diagrams showing direct mapping and inverse gain mapping, respectively. The LUT in FIG. 17A is a direct-mapped LUT 1710, and the LUT in FIG. 17B is an inverse-gain-mapped LUT 1720.

Brute force, i.e., use of a linear direct mapping as shown in FIG. 17A, results in degraded performance. If $f(\cdot)$ is the nonlinear mapping that is desired in the LUT, and n bits are assumed to be used for each LUT entry, a quantized mapping $\tilde{f}$ results:

$$\tilde{f} = f + e_q, \quad (23)$$

where $e_q$ is the mapping quantization introduced. Consequently, the quantized LUT output signal is related to the unquantized output signal by:

$$\tilde{\rho}_{pred} = \rho_{pred} + e_q. \quad (24)$$

This results in an output SNR of:

$$SNR(\rho) \approx \frac{\rho^2}{\sigma_q^2}. \quad (25)$$

Clearly the SNR degrades as the amplitude of the signal $\rho$ decreases.

6.2. Inverse Gain Mapping

An alternate to counter the above reduced SNR is to use an inverse gain mapping function $g(\cdot)$, such that the desired LUT mapping $f(\cdot)$ is realized as:

$$f(\rho_{in}) = \rho_{in} \times g(\rho_{in}) = \rho_{pred}. \quad (26)$$

In this case the quantization in the LUT output is due to the finite number of bits used for the inverse gain LUT $g(\cdot)$, i.e.:

$$\tilde{g} = g + e_q. \quad (27)$$

The LUT output signal can now be expressed as:

$$\tilde{\rho}_{pred} = \rho_{pred} + \rho_{in} e_q \quad (28)$$

The SNR of this LUT output signal now becomes:

$$SNR(\rho) \approx \frac{|g(\rho)|^2}{\sigma_q^2} \quad (29)$$

which is almost constant across its entire range.

Figure 18A:
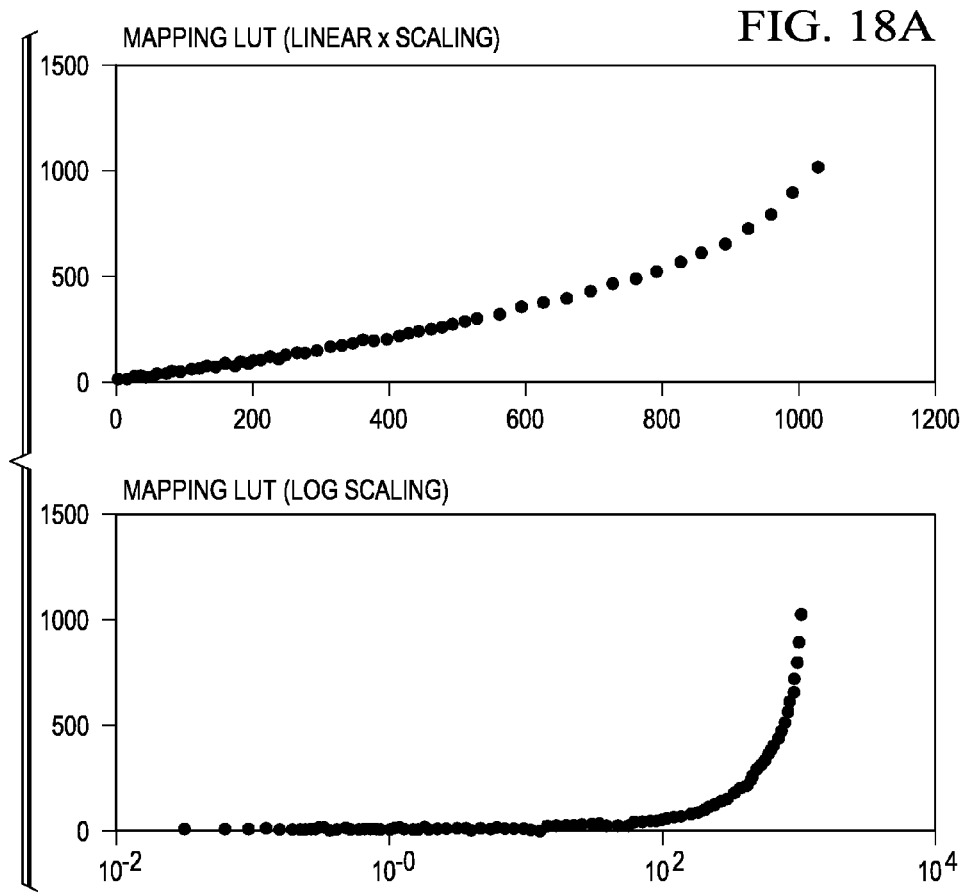
FIGS. 18A and 18B are linear/log scale plots showing LUT step size across a 10-bit input for direct mapping and inverse gain LUT configurations, respectively.
Figure 18B:
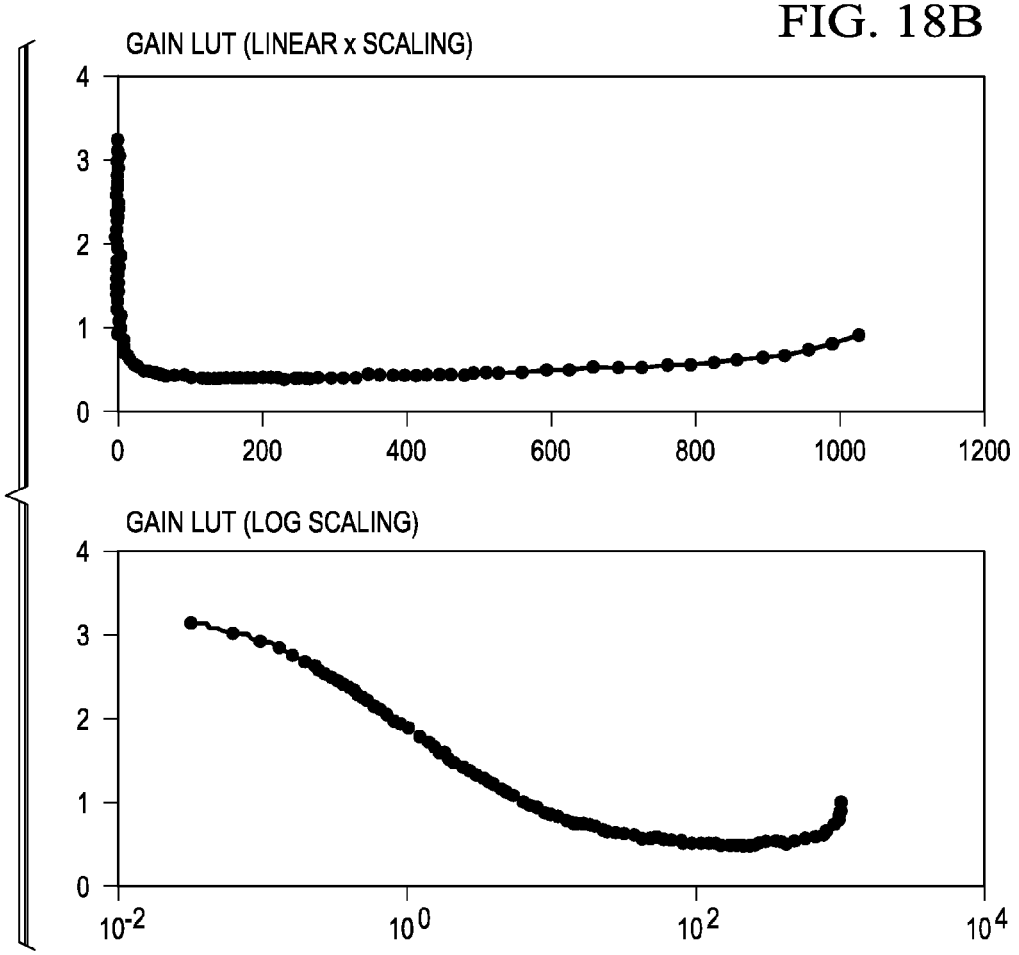

The LUT step size as a function of input 10-bit LUT code is graphically shown in FIGS. 18A and 18B.

6.3. Other Approaches

The output signal dynamic range can also be improved using a fixed bit-width floating point (i.e., mantissa, exponent format). However, use of such a format complicates the interpolation computation between successive LUT entries and therefore has not been pursued in this work.

6.4. Simulated Performance

A simulated comparison of the LUT output SNR impact on the WCDMA transmitter performance has been carried out. It is observed that across the >90 dB power dynamic range of the LUT, while direct mapping architecture requires 19 bits, the inverse gain LUT approach requires only ten bits for comparative performance. The results have been summarized in FIGS. 19A, 19B, 20A, 20B, 21A and 21B.

Figure 22:
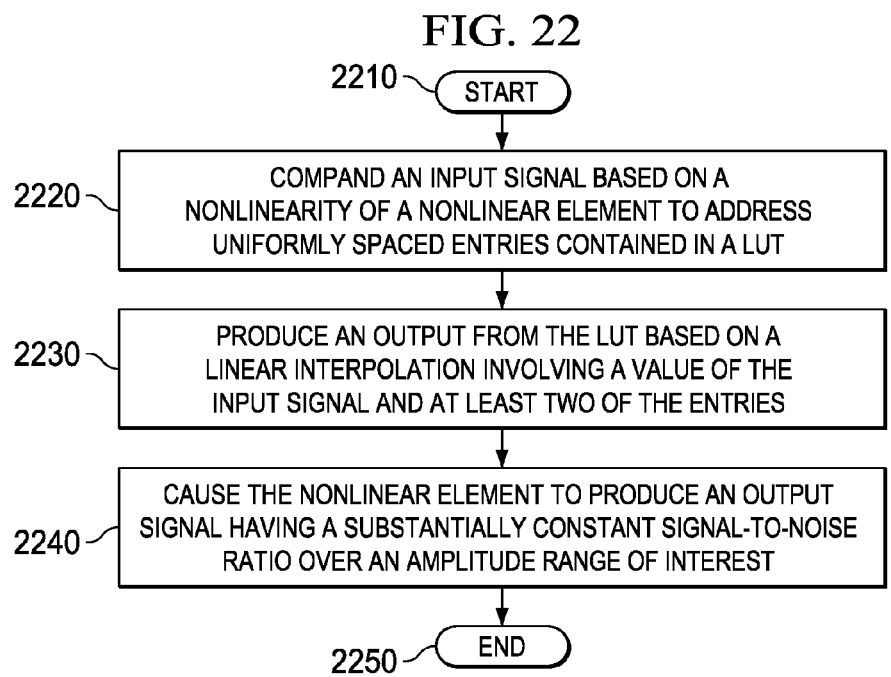
FIG. 22 is a flow diagram of one embodiment of a method of predistorting for a nonlinear element carried out according to the principles of the invention.

FIG. 22 is a flow diagram of one embodiment of a method of addressing a large-dynamic-range LUT carried out according to the principles of the invention. The method begins in a start step 2210. In a step 2220, an input signal is companded based on a nonlinearity of the nonlinear element to address uniformly spaced entries contained in a LUT. The companding may be μ-law companding. In a step 2230, an output is produced from the LUT based on a linear interpolation involving a value of the input signal and at least two of the entries. In a step 2240, the nonlinear element is caused to produce an output signal having a substantially constant signal-to-noise ratio over an amplitude range of interest. The method ends in an end step 2250.

Figure 23:
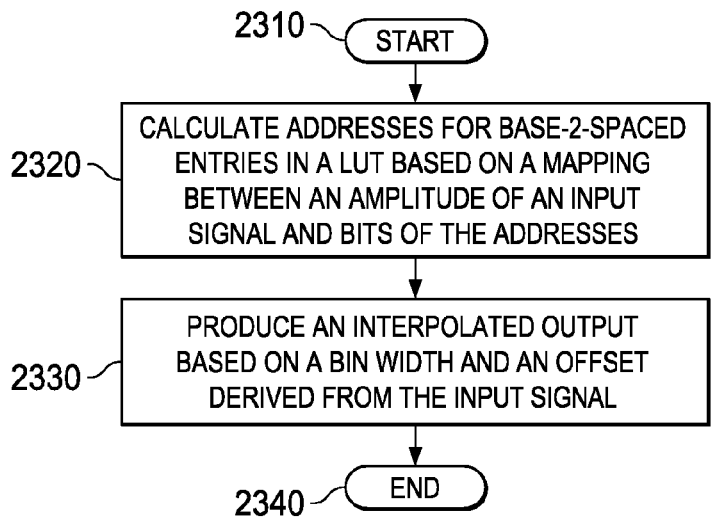
FIG. 23 is a flow diagram of another embodiment of a method of predistorting for a nonlinear element carried out according to the principles of the invention.
Figure 19A:
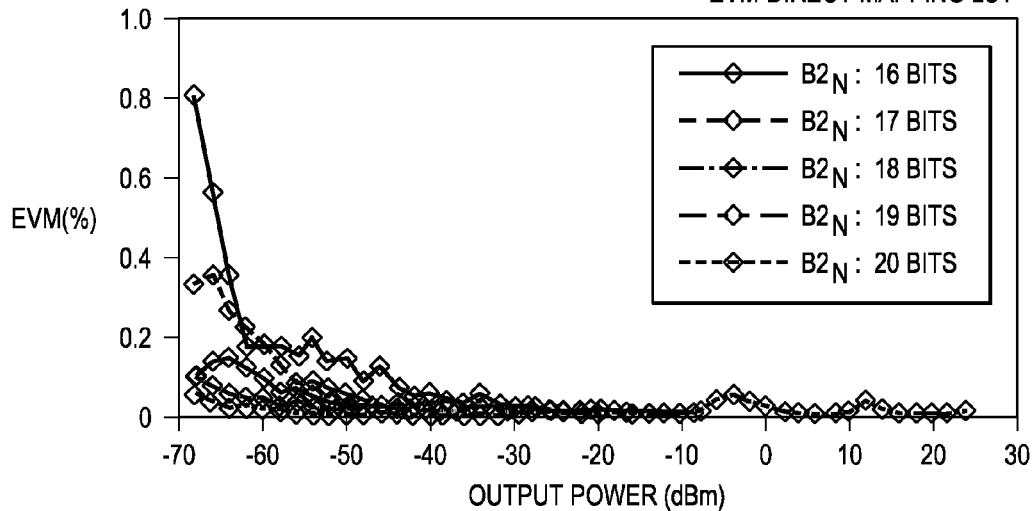
FIGS. 19A and 19B are plots showing the effect of WCDMA transmitter EVM performance using improved base-2 spacing for a direct mapping LUT using 16-20 bits and an inverse gain LUT using 8-13 bits, respectively.
Figure 19B:
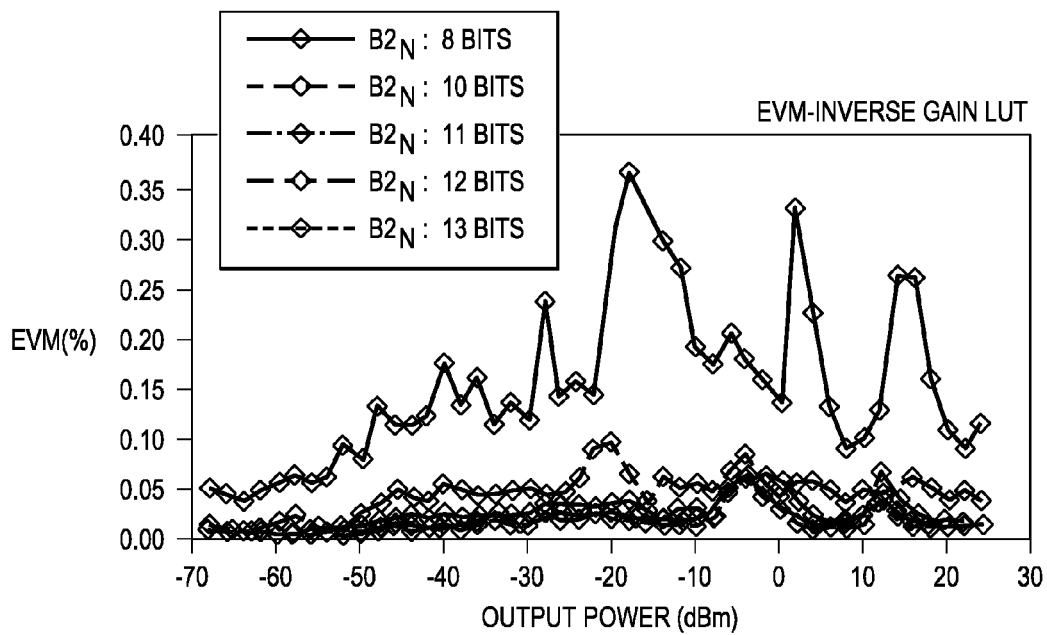
Figure 20A:
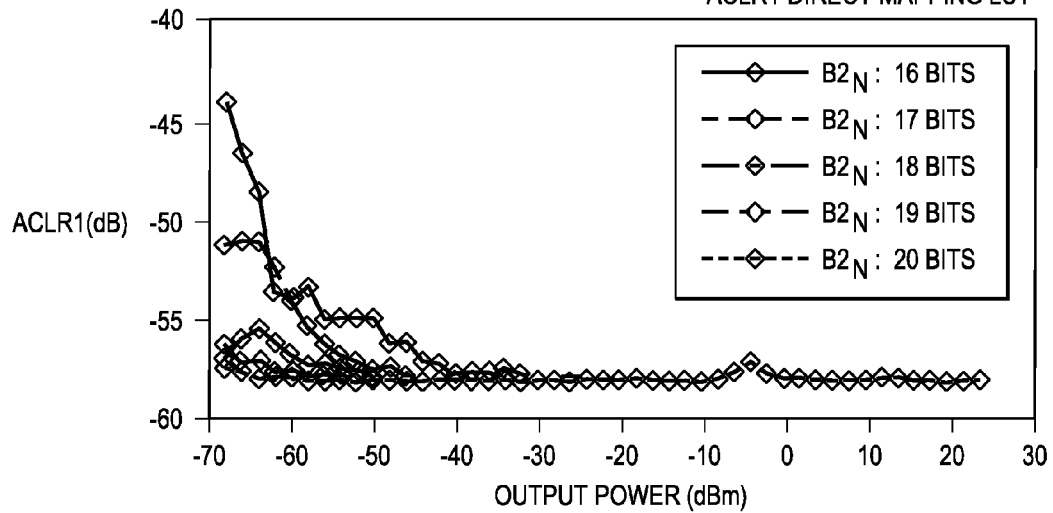
FIGS. 20A and 20B are plots showing the effect of WCDMA transmitter ACLR1 performance using improved base-2 spacing for a direct mapping LUT using 16-20 bits and an inverse gain LUT using 8-13 bits, respectively.
Figure 20B:
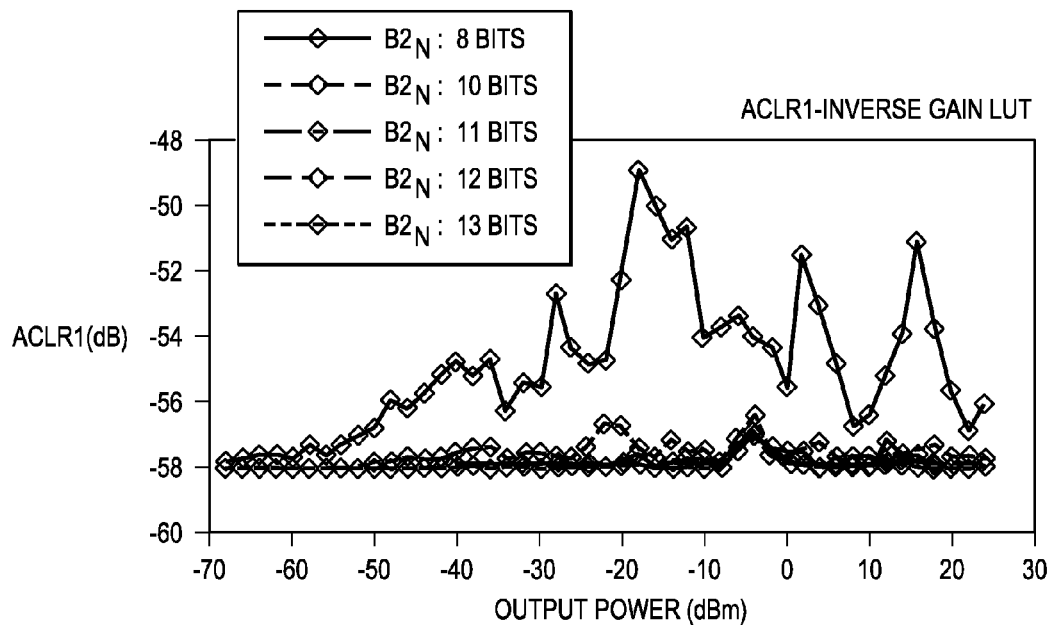
Figure 21A:
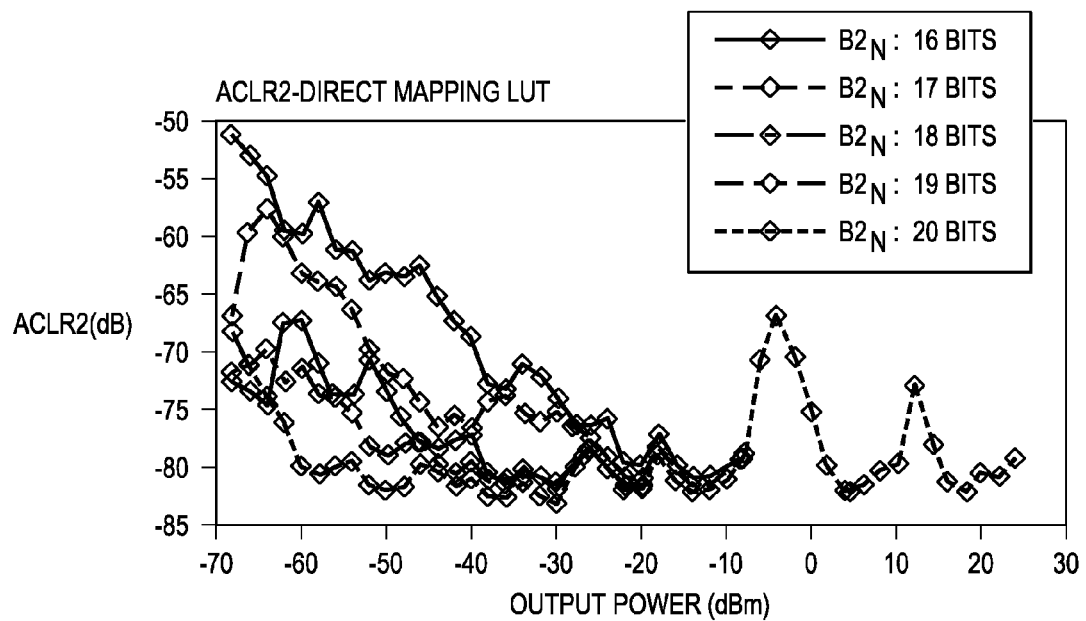
FIGS. 21A and 21B are plots showing the effect of WCDMA transmitter ACLR2 performance using improved base-2 spacing for a direct mapping LUT using 16-20 bits and an inverse gain LUT using 8-13 bits, respectively.
Figure 21B:
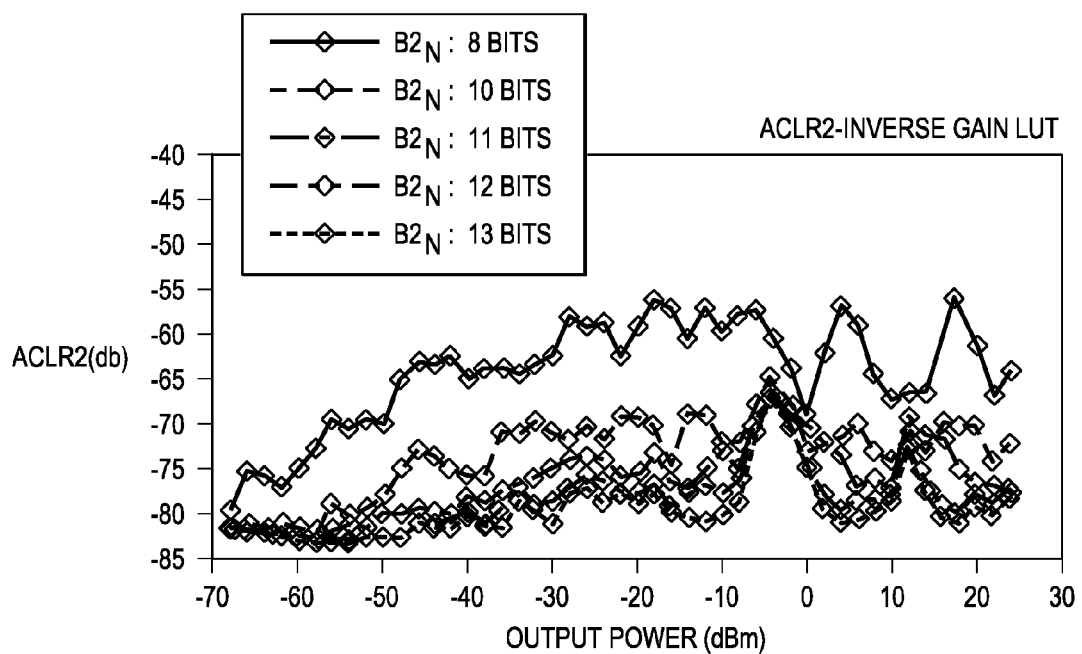

FIG. 23 is a flow diagram of another embodiment of a method of addressing a large-dynamic-range LUT carried out according to the principles of the invention. The method begins in a start step 2310. In a step 2320, addresses are calculated for base-2-spaced entries in a LUT based on a mapping between an amplitude of an input signal and bits of the addresses. In a step 2330, an interpolated output is produced based on a bin width and an offset derived from the input signal. The step 2330 may include employing a 13 most significant bits of the amplitude to calculate the addresses. The method ends in an end step 2340.

Those skilled in the art to which the invention relates will appreciate that other and further additions, deletions, substitutions and modifications may be made to the described embodiments without departing from the scope of the invention.

What is claimed is:

1. A predistorter for use with a nonlinear element, comprising:
    a lookup table having non-uniformly spaced entries therein;
    a compander configured to compand an input signal based on a nonlinearity of said nonlinear element to address said entries; and
    an interpolation offset calculation circuit associated with said lookup table and configured to produce an output based on a value of said input signal and a linear interpolation involving at least two entries from said lookup table.

2. The predistorter as recited in claim 1 wherein addressing of said entries is based on amplitude of said input signal.

3. The predistorter as recited in claim 1 wherein values of said entries contain at least one selected from the group consisting of:
    an output amplitude,
    a phase,
    a real gain, and
    a complex gain for at least one modulation signal.

4. The predistorter as recited in claim 1 wherein said predistorter causes said nonlinear element to produce an output signal having a substantially constant signal-to-noise ratio over an amplitude range of interest.

5. The predistorter as recited in claim 1 wherein said lookup table is an inverse-gain-mapped lookup table.

6. A predistorter for use with a nonlinear element, comprising:
    a lookup table having non-uniformly spaced entries therein;
    a compander configured to compand an input signal based on a nonlinearity of said nonlinear element to address said entries, wherein said compander is configured to employ a metric based on a constant signal signal-to-noise ratio (SNR) to compand said input signal; and
    an interpolation offset calculation circuit associated with said lookup table and configured to produce an output based on a value of said input signal and a linear interpolation involving at least two entries from said lookup table.

7. A predistorter for use with a nonlinear element, comprising:
    a lookup table having non-uniformly spaced entries therein;
    a compander configured to compand an input signal based on a nonlinearity of said nonlinear element to address said entries, wherein said nonlinear element is an amplifier contained in a WCDMA transmitter; and
    an interpolation offset calculation circuit associated with said lookup table and configured to produce an output based on a value of said input signal and a linear interpolation involving at least two entries from said lookup table.

8. A method of predistorting for a nonlinear element, comprising:
    companding an input signal based on a nonlinearity of said nonlinear element to address non-uniformly spaced entries contained in a lookup table; and
    producing an output from said lookup table based on a linear interpolation involving a value of said input signal and at least two of said entries.

9. The method as recited in claim 8 wherein said entries are based on amplitude of said input signal.

10. The method as recited in claim 8 wherein values of said entries contain at least one selected from the group consisting of:
    an output amplitude,
    a phase,
    a real gain, and
    a complex gain for at least one modulation signal.

11. The method as recited in claim 8 further comprising causing said nonlinear element to produce an output signal having a substantially constant signal-to-noise ratio over an amplitude range of interest.

12. The method, as recited in claim 8 wherein said lookup table is an inverse-gain-mapped lookup table.

13. A method of predistorting for a nonlinear element, comprising:
    companding an input signal based on a nonlinearity of said nonlinear element to address non-uniformly spaced entries contained in a lookup table; and
    producing an output from said lookup table based on a linear interpolation involving a value of said input signal and at least two of said entries, wherein said producing comprises employing a metric based on a constant signal signal-to-noise ratio (SNR) for said companding.

14. A method of predistorting for a nonlinear element, comprising:
- companding an input signal based on a nonlinearity of said nonlinear element to address non-uniformly spaced entries contained in a lookup table, wherein said nonlinear element is an amplifier contained in a WCDMA transmitter; and
- producing an output from said lookup table based on a linear interpolation involving a value of said input signal and at least two of said entries.

15. A predistorter for use with a nonlinear element, comprising:
- a lookup table containing base-2-spaced entries;
- an address calculation block associated with said lookup table and configured to calculate addresses for said entries based on a mapping between an amplitude of an input signal and bits of said addresses; and
- an interpolation circuit associated with said lookup table and configured to produce a selected one of an interpolation factor and an interpolated output based on a bin width and an offset derived from said input signal.

16. The predistorter as recited in claim 15 wherein said bin width is a power of two.

17. The predistorter as recited in claim 15 wherein intervals in said lookup table is at least ten and said address calculation block employs a 13 most significant bits of said amplitude to calculate said addresses.

18. The predistorter as recited in claim 15 wherein said lookup table is an inverse-gain-mapped lookup table.

19. The predistorter as recited in claim 15 wherein intervals in said lookup table contain different numbers of entries.

20. A method of predistorting for a nonlinear element, comprising:
- companding an input signal based on a nonlinearity of said nonlinear element to address non-uniformly spaced entries contained in a lookup table, wherein said nonlinear element is an amplifier in a WCDMA transmitter; and
- producing an output from said lookup table based on a linear interpolation involving a value of said input signal and at least two of said entries.

21. A method of predistorting for a nonlinear element, comprising:
- calculating addresses for base-2-spaced entries in a lookup table based on a mapping between an amplitude of an input signal and bits of said addresses; and
- producing a selected one of an interpolation factor and an interpolated output based on a bin width and an offset derived from said input signal.

22. The method as recited in claim 21 wherein said bin width is a power of two.

23. The method as recited in claim 21 wherein at least ten of said intervals are in said lookup table and said producing comprises employing a 13 most significant bits of said amplitude to calculate said addresses.

24. The method as recited in claim 21 wherein said lookup table is an inverse-gain-mapped lookup table.

25. The method as recited in claim 21 wherein intervals in said lookup table contain different numbers of entries.

26. A method of predistorting for a nonlinear element, comprising:
- calculating addresses for base-2-spaced entries in a lookup table based on a mapping between an amplitude of an input signal and bits of said addresses; and
- producing a selected one of an interpolation factor and an interpolated output based on a bin width and an offset derived from said input signal, wherein said nonlinear element is an amplifier in a WCDMA transmitter.

27. A predistorter for use with a nonlinear element, comprising:
- a lookup table having non-uniformly spaced entries therein;
- a compander configured to compand an input signal based on a nonlinearity of said nonlinear element to address said entries, wherein said nonlinear element is an amplifier; and
- an interpolation offset calculation circuit associated with said lookup table and configured to produce an output based on a value of said input signal and a linear interpolation involving at least two entries from said lookup table.

28. A method of predistorting for a nonlinear element, comprising:
- companding an input signal based on a nonlinearity of said nonlinear element to address non-uniformly spaced entries contained in a lookup table, wherein said nonlinear element is an amplifier; and
- producing an output from said lookup table based on a linear interpolation involving a value of said input signal and at least two of said entries.

29. A method of predistorting for a nonlinear element, comprising:
- calculating addresses for base-2-spaced entries in a lookup table based on a mapping between an amplitude of an input signal and bits of said addresses; and
- producing a selected one of an interpolation factor and an interpolated output based on a bin width and an offset derived from said input signal, wherein said nonlinear element is an amplifier.

* * * * *